US008530060B2

(12) United States Patent
Ushikubo et al.

(10) Patent No.: US 8,530,060 B2
(45) Date of Patent: Sep. 10, 2013

(54) LIGHT-EMITTING ELEMENT INCLUDING FIRST LAYER, SECOND LAYER, THIRD LAYER AND FOURTH LAYER

(75) Inventors: Takahiro Ushikubo, Kanagawa (JP); Satoshi Seo, Kanagawa (JP); Nobuharu Ohsawa, Kanagawa (JP); Shunpei Yamazaki, Tokyo (JP)

(73) Assignee: Semiconductor Energy Laboratory Co., Ltd. (JP)

( * ) Notice: Subject to any disclaimer, the term of this patent is extended or adjusted under 35 U.S.C. 154(b) by 474 days.

(21) Appl. No.: 12/463,576

(22) Filed: May 11, 2009

(65) Prior Publication Data

US 2009/0284139 A1    Nov. 19, 2009

(30) Foreign Application Priority Data

May 16, 2008    (JP) ................................ 2008-130012

(51) Int. Cl.
*H01L 51/54*    (2006.01)
(52) U.S. Cl.
USPC ............................ 428/690; 428/917; 313/504
(58) Field of Classification Search
None
See application file for complete search history.

(56) References Cited

U.S. PATENT DOCUMENTS

| 6,447,934 | B1 | 9/2002 | Suzuki et al. | |
|---|---|---|---|---|
| 6,803,120 | B2 | 10/2004 | Fukuoka et al. | |
| 7,692,199 | B2 | 4/2010 | Arai | |
| 7,733,441 | B2 | 6/2010 | Seo et al. | |
| 8,022,900 | B2 | 9/2011 | Koh et al. | |
| 2003/0184217 | A1* | 10/2003 | Yamazaki et al. | 313/505 |
| 2005/0019606 | A1 | 1/2005 | Fukuoka et al. | |
| 2005/0100760 | A1* | 5/2005 | Yokoyama | 428/690 |
| 2005/0129982 | A1 | 6/2005 | Fukuoka et al. | |
| 2006/0232194 | A1* | 10/2006 | Tung et al. | 313/504 |
| 2007/0001587 | A1 | 1/2007 | Hatwar et al. | |
| 2007/0134515 | A1 | 6/2007 | Fukuoka et al. | |
| 2007/0194711 | A1 | 8/2007 | Matsuura et al. | |
| 2007/0228938 | A1 | 10/2007 | Hatwar et al. | |
| 2008/0017853 | A1 | 1/2008 | Egawa et al. | |
| 2009/0085479 | A1 | 4/2009 | Ushikubo | |
| 2009/0102366 | A1 | 4/2009 | Ushikubo et al. | |
| 2009/0108734 | A1 | 4/2009 | Begley et al. | |

FOREIGN PATENT DOCUMENTS

| JP | 10-233284 | 9/1998 |
|---|---|---|
| JP | 2000-30868 | 1/2000 |
| JP | 2000-182768 | 6/2000 |
| JP | 2006-114796 | 4/2006 |
| JP | 2007-140530 | 6/2007 |
| JP | 2007-220593 | 8/2007 |

OTHER PUBLICATIONS

Lu, Y-J et al, "25.2: Achieving Three-Peak White Organic Light-Emitting Devices Using Wavelength-Selective Mirror Electrodes," SID 07 Digest, 2007, pp. 1110-1113.
C. Adachi, "Device Physics, Material Chemistry, and Device Application of Organic Light Emitting Diodes", Dec. 14, 2007, pp. 257-267.
S.C. Tse et al., "Experimental and Theoretical Demonstration on the Transport Properties of Fused Ring Host Materials for Organic Light-Emitting Diodes," Jpn. J. Appl. Phys., 2006, pp. 555-557, vol. 45, No. 1B.
Extended Search Report re European application No. 09159589.2, dated Jul. 25, 2012.

* cited by examiner

*Primary Examiner* — Jennifer Chriss
*Assistant Examiner* — Andrew K Bohaty
(74) *Attorney, Agent, or Firm* — Husch Blackwell LLP

(57) ABSTRACT

A layer including an organic compound at least includes a layer serving as a light-emitting layer in which a first layer, a second layer, a third layer, and a fourth layer are stacked in that order over an anode. The first layer includes a first light-emitting substance, the second layer includes a second light-emitting substance, the third layer includes a third light-emitting substance, and the fourth layer includes a fourth light-emitting substance. Emission peak wavelengths of the first light-emitting substance and the fourth light-emitting substance are shorter than an emission peak wavelength of the third light-emitting substance, and the emission peak wavelength of the third light-emitting substance is shorter than an emission peak wavelength of the second light-emitting substance. Each of the first layer, the second layer, and the third layer has a hole-transporting property, and the fourth layer has an electron-transporting property.

20 Claims, 13 Drawing Sheets

LIGHT-EMITTING ELEMENT INCLUDING FIRST LAYER, SECOND LAYER, THIRD LAYER AND FOURTH LAYER

BACKGROUND OF THE INVENTION

1. Field of the Invention

The present invention relates to light-emitting elements including an organic compound at least as a part thereof. The present invention also relates to lighting apparatuses, light-emitting devices, electronic appliances, and displays which include the light-emitting element.

2. Description of the Related Art

Development of a light emitting device including a light-emitting element in which a layer including an organic compound is provided between a pair of electrodes and light emission is obtained by current flowing between the pair of electrodes has been advanced. Such a light-emitting device can reduce thickness and weight of a display device in comparison with a display device which is currently called a "thin display device". Moreover, such a light-emitting device is of a self-emission type, and therefore, has a high level of visibility and high response speed. Accordingly, such a light-emitting device has been actively developed as a next-generation display device, and has been partly put into practical use at present.

Such a light-emitting element can emit light in various colors depending on a material serving as an emission center which is included in a layer including an organic compound. Moreover, by stacking layers each including an emission center substance which exhibits different emission colors from each other, light emitted from the layers is mixed, and a wide variety of emission colors can be obtained. In particular, the emphasis is put on white light because white light is suitable for the use of a backlight or lighting in addition to a display. The white light can be obtained by mixing red light, green light, and blue light or mixing emission colors which are in a relationship of complementary colors (see Non-patent Document 1 and Non-patent Document 2).

Deterioration of a light-emitting element is one of the main reasons why such a light-emitting device including the above-described light-emitting element with many advantages is limited to a partial practical use. A light-emitting element deteriorates such that the luminance is lowered with accumulation of a driving time even if a constant current is fed to the light-emitting element. In order to widely promote the light-emitting device, it is necessary to obtain a light-emitting element whose degree of deterioration is acceptable in a product use; therefore, a light-emitting element has been studied from many aspects such as a driver circuit, sealing, an element structure, and a material.

In addition, light-emission efficiency of the light-emitting element is also an important factor. By improving the light-emission efficiency, electric power needed to provide light with given brightness of the same color can be reduced. That is, as energy problems are getting more serious today, if the same brightness can be obtained with smaller energy, products with higher added values can be provided. Further, an improvement in light-emission efficiency can reduce the amount of current flowing into a light-emitting element to emit light with given brightness of the same color, which leads to suppression of deterioration. Although comparison between light of different colors are not easy, quantum efficiency gives an indication.

[Non-patent Document 1] *Device physics, Material Chemistry, and Device Application of Organic Light Emitting Diodes*, editorial supervisor Chihaya ADACH1, published by CMC Publishing CO., LTD, December, 2007, pp. 257-267.

[Non-patent Document 2] Yin-Jui Lu, et al., "Achieving Three-Peak White Organic Light-Emitting Devices Using Wavelength-Selective Mirror Electrodes", SID07 Digest, 2007, pp. 1110-1113.

SUMMARY OF THE INVENTION

An object according to one embodiment of the present invention is to provide a light-emitting element with improved light-emission efficiency. In addition, another object according to one embodiment of the present invention is to provide a light-emitting element or lighting apparatus whose degree of deterioration with a driving time is improved.

It is another object according to one embodiment of the present invention to provide a light-emitting device or electronic appliance which has a highly reliable display portion.

It is another object according to one embodiment of the present invention to provide a light-emitting element or lighting apparatus whose emission color is easily adjusted.

It is another object according to one embodiment of the present invention to provide a light-emitting device or electronic appliance with a high display quality.

An embodiment of the present invention is a light-emitting element including an anode, a cathode, and a layer including an organic compound between the anode and the cathode. The layer including an organic compound at least includes a layer having in which a first layer, a second layer, a third layer, and a fourth layer are stacked in that order over the anode, and which has a light-emitting function. The first layer includes a first light-emitting substance, the second layer includes a second light-emitting substance, the third layer includes a third light-emitting substance, and the fourth layer includes a fourth light-emitting substance. Emission peak wavelengths of the first light-emitting substance and the fourth light-emitting substance are shorter than an emission peak wavelength of the third light-emitting substance, and the emission peak wavelength of the third light-emitting substance is shorter than an emission peak wavelength of the second light-emitting substance. Each of the first layer, the second layer, and the third layer has a hole-transporting property, and the fourth layer has an electron-transporting property.

Another embodiment of the present invention is a light-emitting element including an anode, a cathode, and a layer including an organic compound between the anode and the cathode. The layer including an organic compound at least includes a layer in which a first layer, a second layer, a third layer, and a fourth layer are stacked in that order over the anode, and which has a light-emitting function. The first layer includes a first light-emitting substance, the second layer includes a second organic compound and a second light-emitting substance, the third layer includes a third organic compound and a third light-emitting substance, and the fourth layer includes a fourth organic compound and a fourth light-emitting substance. Emission peak wavelengths of the first light-emitting substance and the fourth light-emitting substance are shorter than an emission peak wavelength of the third light-emitting substance, and the emission peak wavelength of the third light-emitting substance is shorter than an emission peak wavelength of the second light-emitting substance. Each of the first layer, the second layer, and the third layer has a hole-transporting property, and the fourth layer has an electron-transporting property.

Another embodiment of the present invention is a light-emitting element including an anode, a cathode, and a layer including an organic compound between the anode and the cathode. The layer including an organic compound at least includes a layer in which a first layer, a second layer, a third layer, and a fourth layer are stacked in that order over the anode, and which has a light-emitting function. The first layer includes a first light-emitting substance, the second layer includes a second organic compound and a second light-emitting substance, the third layer includes a third organic compound and a third light-emitting substance, and the fourth layer includes a fourth organic compound and a fourth light-emitting substance. The rate of the second light-emitting substance in the second layer is equal to or greater than 0.1 wt % and less than 50 wt %, the rate of the third light-emitting substance in the third layer is equal to or greater than 0.1 wt % and less than 50 wt %, and the rate of the fourth light-emitting substance in the fourth layer is equal to or greater than 0.1 wt % and less than 50 wt %. Emission peak wavelengths of the first light-emitting substance and the fourth light-emitting substance are shorter than an emission peak wavelength of the third light-emitting substance, and the emission peak wavelength of the third light-emitting substance is shorter than an emission peak wavelength of the second light-emitting substance. Each of the first layer, the second layer, and the third layer has a hole-transporting property, and the fourth layer has an electron-transporting property.

Another embodiment of the present invention is a light-emitting element including an anode, a cathode, and a layer including an organic compound between the anode and the cathode. The layer including an organic compound at least includes a layer in which a first layer, a second layer, a third layer, and a fourth layer are stacked in that order over the anode, and which has a light-emitting function. The first layer includes a first organic compound and a first light-emitting substance, the second layer includes a second organic compound and a second light-emitting substance, the third layer includes a third organic compound and a third light-emitting substance, and the fourth layer includes a fourth organic compound and a fourth light-emitting substance. Emission peak wavelengths of the first light-emitting substance and the fourth light-emitting substance are shorter than an emission peak wavelength of the third light-emitting substance, and the emission peak wavelength of the third light-emitting substance is shorter than an emission peak wavelength of the second light-emitting substance. Each of the first layer, the second layer, and the third layer has a hole-transporting property, and the fourth layer has an electron-transporting property.

Another embodiment of the present invention is a light-emitting element including an anode, a cathode, and a layer including an organic compound between the anode and the cathode. The layer including an organic compound at least includes a layer in which a first layer, a second layer, a third layer, and a fourth layer are stacked in that order over the anode, and which has a light-emitting function. The first layer includes a first organic compound and a first light-emitting substance, the second layer includes a second organic compound and a second light-emitting substance, the third layer includes a third organic compound and a third light-emitting substance, and the fourth layer includes a fourth organic compound and a fourth light-emitting substance. The rate of the first light-emitting substance in the first layer is equal to or greater than 0.1 wt % and less than 50 wt %, the rate of the second light-emitting substance in the second layer is equal to or greater than 0.1 wt % and less than 50 wt %, the rate of the third light-emitting substance in the third layer is equal to or greater than 0.1 wt % and less than 50 wt %, and the rate of the fourth light-emitting substance in the fourth layer is equal to or greater than 0.1 wt % and less than 50 wt %. Emission peak wavelengths of the first light-emitting substance and the fourth light-emitting substance are shorter than an emission peak wavelength of the third light-emitting substance, and the emission peak wavelength of the third light-emitting substance is shorter than an emission peak wavelength of the second light-emitting substance. Each of the first organic compound, the second organic compound, and the third organic compound has a hole-transporting property, and the fourth organic compound has an electron-transporting property.

Another embodiment of the present invention is a light-emitting element having any one of the above-described structures in which each of the second organic compound and the third organic compound is one of tricyclic to hexacyclic condensed aromatic compounds.

Another embodiment of the present invention is a light-emitting element having any one of the above-described structures in which each of the second organic compound and the third organic compound is an anthracene derivative.

Another embodiment of the present invention is a light-emitting element having any one of the above-described structures in which blue light is emitted from the first layer, red light is emitted from the second layer, green light is emitted from the third layer, and blue light is emitted from the fourth layer.

Another embodiment of the present invention is a light-emitting element having any one of the above-described structures in which a peak wavelength of light emitted from the first layer is in the range of 400 nm to 480 nm, a peak wavelength of light emitted from the second layer is in the range of 580 nm to 700 nm, a peak wavelength of light emitted from the third layer is in the range of 490 nm to 560 nm, and a peak wavelength of light emitted from the fourth layer is in the range of 400 nm to 480 nm.

Another embodiment of the present invention is a light-emitting element including an anode, a cathode, and a layer including an organic compound between the anode and the cathode. The layer including an organic compound at least includes a layer in which a first layer, a second layer, a third layer, and a fourth layer are stacked in that order over the anode, and which has a light-emitting function. The first layer includes a first light-emitting substance, the second layer includes a second light-emitting substance, the third layer includes a third light-emitting substance, and the fourth layer includes a fourth light-emitting substance. Emission peak wavelengths of the first light-emitting substance and the fourth light-emitting substance are shorter than an emission peak wavelength of the second light-emitting substance, and the emission peak wavelength of the second light-emitting substance is shorter than an emission peak wavelength of the third light-emitting substance. The first layer has a hole-transporting property, and each of the second layer, the third layer, and the fourth layer has an electron-transporting property.

Another embodiment of the present invention is a light-emitting element including an anode, a cathode, and a layer including an organic compound between the anode and the cathode. The layer including an organic compound at least includes a layer in which a first layer, a second layer, a third layer, and a fourth layer are stacked in that order over the anode, and which has a light-emitting function. The first layer includes a first light-emitting substance, the second layer includes a second organic compound and a second light-emitting substance, the third layer includes a third organic compound and a third light-emitting substance, and the fourth layer includes a fourth organic compound and a fourth light-emitting substance. Emission peak wavelengths of the first light-emitting substance and the fourth light-emitting substance are shorter than an emission peak wavelength of the second light-emitting substance, and the emission peak wavelength of the second light-emitting substance is shorter than an emission peak wavelength of the third light-emitting substance. The first layer has a hole-transporting property, and each of the second layer, the third layer, and the fourth layer has an electron-transporting property.

Another embodiment of the present invention is a light-emitting element including an anode, a cathode, and a layer including an organic compound between the anode and the cathode. The layer including an organic compound at least includes a layer in which a first layer, a second layer, a third layer, and a fourth layer are stacked in that order over the anode, and which has a light-emitting function. The first layer includes a first light-emitting substance, the second layer includes a second organic compound and a second light-emitting substance, the third layer includes a third organic compound and a third light-emitting substance, and the fourth layer includes a fourth organic compound and a fourth light-emitting substance. The rate of the second light-emitting substance in the second layer is equal to or greater than 0.1 wt % and less than 50 wt %, the rate of the third light-emitting substance in the third layer is equal to or greater than 0.1 wt % and less than 50 wt %, and the rate of the fourth light-emitting substance in the fourth layer is equal to or greater than 0.1 wt % and less than 50 wt %. Emission peak wavelengths of the first light-emitting substance and the fourth light-emitting substance are shorter than an emission peak wavelength of the second light-emitting substance, and the emission peak wavelength of the second light-emitting substance is shorter than an emission peak wavelength of the third light-emitting substance. The first layer has a hole-transporting property, and each of the second organic compound, the third organic compound, and the fourth organic compound has an electron-transporting property.

Another embodiment of the present invention is a light-emitting element including an anode, a cathode, and a layer including an organic compound between the anode and the cathode. The layer including an organic compound at least includes a layer in which a first layer, a second layer, a third layer, and a fourth layer are stacked in that order over the anode, and which has a light-emitting function. The first layer includes a first organic compound and a first light-emitting substance, the second layer includes a second organic compound and a second light-emitting substance, the third layer includes a third organic compound and a third light-emitting substance, and the fourth layer includes a fourth organic compound and a fourth light-emitting substance. Emission peak wavelengths of the first light-emitting substance and the fourth light-emitting substance are shorter than an emission peak wavelength of the second light-emitting substance, and the emission peak wavelength of the second light-emitting substance is shorter than an emission peak wavelength of the third light-emitting substance. The first layer has a hole-transporting property, and each of the second layer, the third layer, and the fourth layer has an electron-transporting property.

Another embodiment of the present invention is a light-emitting element including an anode, a cathode, and a layer including an organic compound between the anode and the cathode. The layer including an organic compound at least includes a layer in which a first layer, a second layer, a third layer, and a fourth layer are stacked in that order over the anode, and which has a light-emitting function. The first layer includes a first organic compound and a first light-emitting substance, the second layer includes a second organic compound and a second light-emitting substance, the third layer includes a third organic compound and a third light-emitting substance, and the fourth layer includes a fourth organic compound and a fourth light-emitting substance. The rate of the first light-emitting substance in the first layer is equal to or greater than 0.1 wt % and less than 50 wt %, the rate of the second light-emitting substance in the second layer is equal to or greater than 0.1 wt % and less than 50 wt %, the rate of the third light-emitting substance in the third layer is equal to or greater than 0.1 wt % and less than 50 wt %, and the rate of the fourth light-emitting substance in the fourth layer is equal to or greater than 0.1 wt % and less than 50 wt %. Emission peak wavelengths of the first light-emitting substance and the fourth light-emitting substance are shorter than an emission peak wavelength of the second light-emitting substance, and the emission peak wavelength of the second light-emitting substance is shorter than an emission peak wavelength of the third light-emitting substance. The first organic compound has a hole-transporting property, and each of the second organic compound, the third organic compound, and the fourth organic compound has an electron-transporting property.

Another embodiment of the present invention is a light-emitting element having any one of the above-described structures in which each of the second organic compound and the third organic compound is one of tricyclic to hexacyclic condensed aromatic compounds.

Another embodiment of the present invention is a light-emitting element having any one of the above-described structures in which each of the second organic compound and the third organic compound is an anthracene derivative.

Another embodiment of the present invention is a light-emitting element having any one of the above-described structures in which blue light is emitted from the first layer, green light is emitted from the second layer, red light is emitted from the third layer, and blue light is emitted from the fourth layer.

Another embodiment of the present invention is a light-emitting element having any one of the above-described structures in which a peak wavelength of light emitted from the first layer is in the range of 400 nm to 480 nm, a peak wavelength of light emitted from the second layer is in the range of 490 nm to 560 nm, a peak wavelength of light emitted from the third layer is in the range of 580 nm to 700 nm, and a peak wavelength of light emitted from the fourth layer is in the range of 400 nm to 480 nm.

Another embodiment of the present invention is a light-emitting element having any one of the above-described structures whose emission spectrum includes at least one peak in each wavelength range of 400 nm to 480 nm, 490 nm to 560 nm, and 580 nm to 700 nm.

Another embodiment of the present invention is a light-emitting element having any one of the above-described structures in which light emitted from the light-emitting element is white light.

Another embodiment of the present invention is a lighting apparatus including any one of the above-described light-emitting elements. A long-life lighting apparatus with little decrease in luminance with accumulation of a driving time can be obtained by including any one of the above-described light-emitting elements. Moreover, since the emission color is easily adjusted, an emission color suitable for the usage of the lighting apparatus can be provided. In addition, since the light-emitting element with improved light-emission efficiency is used, a lighting apparatus with reduced power consumption can be provided.

Another embodiment of the present invention is a light-emitting device including a light-emitting element having any one of the above-described structures and means for controlling light emission from the light-emitting element. A long-life lighting apparatus with little decrease in luminance with accumulation of a driving time can be obtained by including any one of the above-described light-emitting elements. Moreover, since the emission color is easily adjusted, a light-emitting device having high display quality can be provided. In addition, since the light-emitting element with improved light-emission efficiency is used, a light-emitting device with reduced power consumption can be provided.

Another embodiment of the present invention is an electronic appliance including above-described light-emitting element in its display portion. A long-life lighting apparatus with little decrease in luminance with accumulation of a driving time can be obtained by including any one of the above-described light-emitting elements. Moreover, since the emission color is easily adjusted, an electronic appliance having a high quality display portion can be provided. In addition, since the light-emitting element with improved light-emission efficiency is used, an electronic appliance with reduced power consumption can be provided.

By implementing one embodiment of the present invention, a light-emitting element with improved light-emission efficiency can be provided.

By implementing one embodiment of the present invention, a light-emitting element whose degree of deterioration with a driving time is improved can be provided.

By implementing one embodiment of the present invention, a lighting apparatus whose degree of deterioration with a driving time is improved can be provided.

By implementing one embodiment of the present invention, a light-emitting device or electronic appliance which has a highly reliable display portion can be provided.

By implementing one embodiment of the present invention, a light-emitting element or lighting apparatus whose emission color is easily adjusted can be provided. Further, a light-emitting device or electronic appliance with high display quality can be provided.

DETAILED DESCRIPTION OF THE INVENTION

The present invention will now be described in the embodiments with reference to the drawings. However, the present invention can be implemented with various modes and it will be readily appreciated by those who skilled in the art that modes and details can be modified in various ways without departing from the spirit and the scope of the present invention. Accordingly, the present invention should not be construed as being limited to the description of the embodiments to be given below.

Embodiment 1

Figure 2:
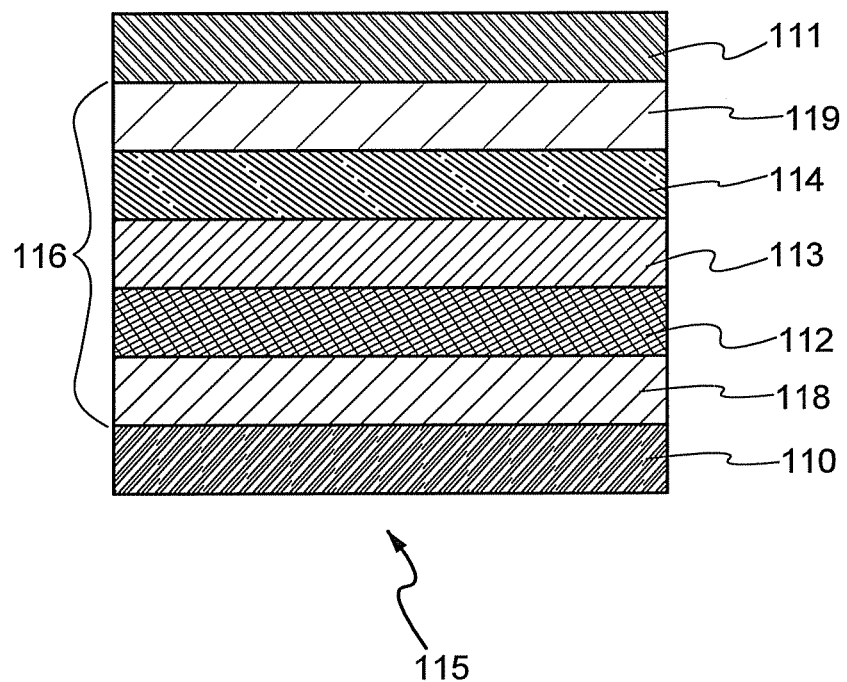
FIG. 2 is a schematic view of a conventional light-emitting element.

In disclosing Embodiment 1, first, a conventional light-emitting element 115, which is to be compared with a light-emitting element of this embodiment, is summarized with reference to FIG. 2. In the light-emitting element 115, a layer 116 including an organic compound is provided between an anode 110 and a cathode 111. The layer 116 including an organic compound at least includes a layer serving as a light-emitting layer in which a first layer 112, a second layer 113, and a third layer 114 are stacked in that order over the anode 110. In addition, a functional layer 118 may be provided between the layer serving as a light-emitting layer and the anode 110, and a functional layer 119 may be provided between the layer serving as a light-emitting layer and the cathode 111 as appropriate. The functional layer 118 is, for example, a hole-transporting layer and/or a hole-injecting layer, and the functional layer 119 is, for example, an electron-injecting layer and/or an electron-transporting layer.

The first layer 112 includes a first light-emitting substance serving as a light emission center and a first organic compound serving as a host material in which the first light-emitting substance is dispersed. The second layer 113 includes a second light-emitting substance serving as a light emission center and a second organic compound serving as a host material in which the second light-emitting substance is dispersed. The third layer 114 includes a third light-emitting substance serving as a light emission center and a third organic compound serving as a host material in which the third light-emitting substance is dispersed. Those three layers have a light-emitting function of the light-emitting element 115. Note that in this conventional light-emitting element, all of the first layer 112 to the third layer 114 are host-guest type light-emitting layers, but it is needless to say that they may be a light-emitting substance layer (which is formed of only a light-emitting substance).

In the light-emitting element 115, when voltage is applied between the anode 110 and the cathode 111 to make current flow, electrons and holes are injected to the layer 116 including an organic compound from the cathode 111 and the anode 110, respectively. Most of the injected carriers are recombined in the vicinity of interfaces between the first layer 112 and the second layer 113 and between the second layer 113 to the third layer 114 and the first light-emitting substance to the third light-emitting substance emit light, whereby three emission spectra of those light-emitting substances overlap and light emission having a plurality of peaks can be obtained.

Figure 1A:
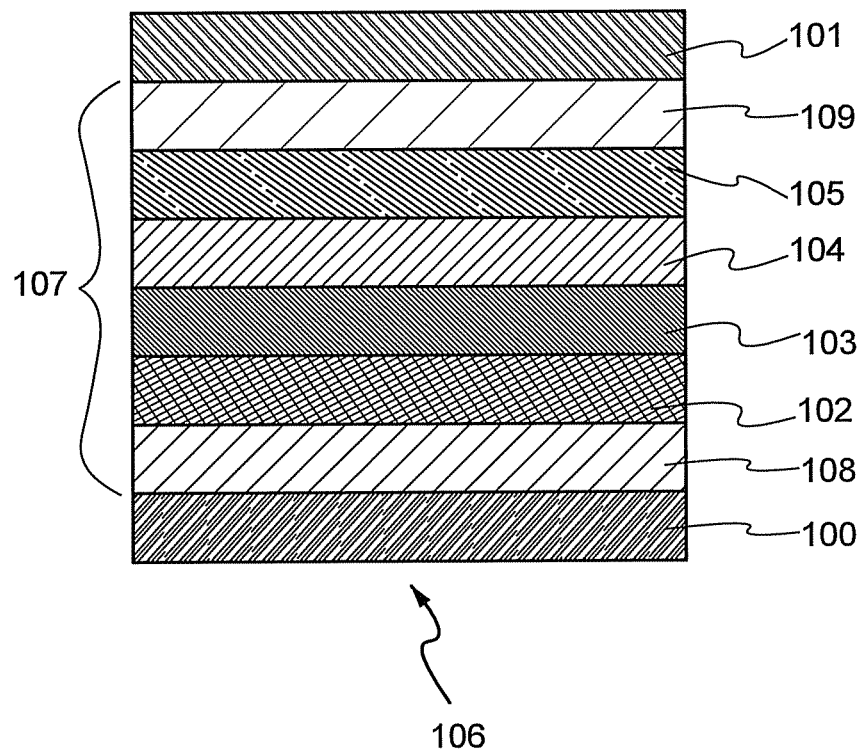
FIGS. 1A and 1B each are a schematic view of a light-emitting element according to one embodiment of the present invention.

A light-emitting element of this embodiment, which is different from the conventional light-emitting element 115, is summarized with reference to FIG. 1A. Light-emission efficiency of the light-emitting element of this embodiment is improved. In addition, the light-emitting element of this embodiment has less deterioration in luminance with respect to a driving time. Further in addition, an emission color of the light-emitting element of this embodiment can be easily adjusted. The light-emitting element will now be described in Embodiment 1 with reference to FIG. 1A.

In the light-emitting element of this embodiment, as in FIG. 1A, a layer 107 including an organic compound is provided between an anode 100 and a cathode 101. The layer 107 including an organic compound at least includes a layer serving as a light-emitting layer in which a first layer 102, a second layer 103, a third layer 104, and a fourth layer 105 are stacked in that order over the anode 100. In addition, a functional layer 108 may be provided between the layer serving as a light-emitting layer and the anode 100 and a functional layer 109 may be provided between the layer serving as a light-emitting layer and the cathode 101 as appropriate. The functional layer 108 is, for example, a hole-transporting layer and/or a hole-injecting layer, and the functional layer 109 is, for example, an electron-injecting layer and/or an electron-transporting layer. Note that the layer 107 including an organic compound should include at least the layer serving as a light-emitting layer in which the first layer 102, the second layer 103, the third layer 104, and the fourth layer 105 are stacked, and the functional layers 108 and 109 are not always necessary. Further, the functional layers 108 and 109 may be a single layer or a stacked layer. Further, the first layer 102 includes a first light-emitting substance, the second layer 103 includes a second light-emitting substance, the third layer 104 includes a third light-emitting substance, and the fourth layer 105 includes a fourth light-emitting substance. The first light-emitting substance and the fourth light-emitting substance included in the first layer 102 and the fourth layer 105, respectively, emit light of the same color. Note that it is preferable that the first light-emitting substance and the fourth light-emitting substance included in the first layer 102 and the fourth layer 105, respectively, be the same light-emitting substance. Here, peak wavelengths of light emitted from the first light-emitting substance and the fourth light-emitting substance are in a shorter wavelength region than a peak wavelength of light emitted from the third light-emitting substance, and the peak wavelength of light emitted from the third light-emitting substance is in a shorter wavelength region than a peak wavelength of light emitted from the second light-emitting substance. Note that light emitted from each of the first light-emitting substance to the fourth light-emitting substance may be either fluorescent light or phosphorescent light.

In a case where the first light-emitting substance to the fourth light-emitting substance are fluorescent substances, a substance with the largest energy gap among the first light-emitting substance to the fourth light-emitting substance is used as the first light-emitting substance and the fourth light-emitting substance, whereas a substance with the smallest energy gap among them is used as the second light-emitting substance. In a case where the first light-emitting substance to the fourth light-emitting substance are phosphorescent substances, a substance which has the largest energy gap between the ground state and the triplet excited state (the triplet energy) among the first light-emitting substance to the fourth light-emitting substance is used as the first light-emitting substance and the fourth light-emitting substance, whereas a substance with the smallest triplet energy among them is used as the second light-emitting substance. Note that as described above, the first light-emitting substance and the fourth light-emitting substance emit light of the same color, and therefore, have approximately the same energy gap or triplet energy. Accordingly, the substance with the largest energy gap among the first light-emitting substance to the fourth light-emitting substance is used as both of the first light-emitting substance and the fourth light-emitting substance. However, in that case, it is needless to say that the two light-emitting substances are not necessarily have exactly the same energy gap and it is acceptable as long as they have substantially the same energy gap. This is also the case for a triplet energy. Further, in a case where a fluorescent substance and a phosphorescent substance are both used as the first light-emitting substance to the fourth light-emitting substance, the same consideration is applicable. In a case where the second layer (a long wavelength side) emits phosphorescence and the third layer (a short wavelength side) emits fluorescence, a substance which has a triplet energy larger than the second light-emitting substance included in the second layer may be selected as the third light-emitting substance included in the third layer.

In addition, the first layer 102 to the third layer 104 have a hole-transporting property and the fourth layer has an electron-transporting property. Accordingly, holes and electrons are recombined with each other in the vicinity of the interface between the third layer 104 and the fourth layer 105, and thus light is emitted from the fourth light-emitting substance included in the fourth layer 105 and the third light-emitting substance included in the third layer 104. The second light-emitting substance included in the second layer 103 emits light mainly due to energy transfer from the third layer 104. Here, electrons which do not contribute to the recombination in the vicinity of the third layer 104 and the fourth layer 105 are captured in the first layer 102 and the first light-emitting substance in the first layer 102 emits light, whereby the light-emission efficiency is improved. Therefore, light emitted from the light-emitting element 106 has a spectrum in which spectra of light emitted from each of the first light-emitting substance, the second light-emitting substance, the third light-emitting substance, and the fourth light-emitting substance are superimposed.

Further, in the light-emitting element 115 in FIG. 2, electrons which pass though a layer serving as a light-emitting layer reach a hole-transporting layer which is provided between the layer serving as a light-emitting layer and the anode 110, which leads to a deterioration in luminance with a driving time. On the other hand, the light-emitting element 106 of this embodiment is provided with the first layer 102 including a light-emitting substance; therefore, the number of electrons reaching the hole-transporting layer is reduced and a degree of deterioration can be lowered.

Further, an excitation energy of a light-emitting substance has the property of transferring from a substance with high energy to a substance with low energy. Therefore, when a recombination region is provided in the vicinity of the interface between the third layer 104 and the fourth layer 105, the excitation energy of the fourth light-emitting substance included in the fourth layer 105 may transfer to the third light-emitting substance included in the third layer 104, which may make the light-emission color difficult to adjust and a desired intense of light with a short wavelength particularly difficult to obtain. However, in the light-emitting element of this embodiment, which is provided with the first layer 102 including the first light-emitting substance, electrons which do not contribute to recombination are recombined in the first layer 102, whereby light is emitted from the first light-emitting substance. Thus, light with a short wavelength can be easily obtained. Accordingly, with the structure of the light-emitting element of this embodiment, a light-emitting element with a desired light-emission color can be easily obtained.

Note that as long as the first layer 102 to the fourth layer 105 have the transporting property mentioned above, they may be either a light-emitting layer so-called light-emitting substance layer which includes a light-emitting substance as its main component or a light-emitting layer of a so-called host-guest type in which a light-emitting substance is dispersed in a host material having an energy gap (or a triplet energy) larger than the light-emitting substance. Further, both of the two kinds of light-emitting layers may be used as the first layer 102 to the fourth layer 105. For example, a light-emitting substance layer may be employed as the first layer 102 and and light-emitting layers of a host-guest type may be employed as the second layer 103 to the fourth layer 105, and therefore, the above two kind of light-emitting layers are may be employed as the first layer 102 to the fourth layer 105. In the host-guest type light-emitting layer, the transporting property of the layer generally depends on the transporting property of the host, which is the main component of the layer. Note that in the case of employing a host-guest type light-emitting layer, the rate of the light-emitting substance in the layer is preferably equal to or greater than 0.1 wt % and less than 50 wt %.

Here, since the first layer 102 to the third layer 104 have a hole-transporting property and the fourth layer has an electron-transporting property in the light-emitting element 106 of this embodiment, in a case where the first layer 102 is a first light-emitting substance layer and the second layer to the fourth layer are light-emitting layers in which the second light-emitting substance to the fourth light-emitting substance are dispersed in the second organic compound to the fourth organic compound, respectively; the first light-emitting substance, the second organic compound, and the third organic compound may have a hole-transporting property and the fourth organic compound may have an electron-transporting property. In order to make electrons which have passed through the second layer to the fourth layer contribute to light emission, it is important that the first layer have a high hole-transporting property so that electrons do not pass therethrough. The first layer is preferably a light-emitting substance layer because when doping is conducted, a trap level at least forms, and thus the hole-transporting property deteriorates. when a structure in which the first layer 102 also is a light-emitting layer of a host-guest type in which the first light-emitting substance is dispersed in the first organic compound is employed as an alternative to the above-described structure of the light-emitting element, the first organic compound to the third organic compound may have a hole-transporting property and the fourth organic compound may have an electron-transporting property.

As a substance suitable for a host material in which a light-emitting substance is dispersed, there is a condensed polycyclic material such as a condensed polycyclic aromatic compound typified by an anthracene derivative. Such a material has a large band gap; thus, excitation energy is difficult to transfer from a light-emitting substance and a decline in light-emission efficiency or a deterioration of color purity is not easily caused. Moreover, such a material has either an electron-transporting property or a hole-transporting property depending on its substituent, and can be applied to light-emitting elements with various structures. However, in some cases, since a condensed polycyclic material having a high hole-transporting property is also capable of transporting electrons to some extent, effects of deterioration due to electrons passing through the light-emitting layer are increased depending on conditions. In such a case, by using the structure of the light-emitting element 106 of this embodiment, deterioration can be effectively suppressed. Note that as the condensed polycyclic material which is used as a host material, tricyclic to hexacyclic condensed aromatic compounds are especially effective to be used.

Note that the above-described structure of the light-emitting element 106 of this embodiment is also very effective in obtaining white light emission. When the structure of the light-emitting element 106 of this embodiment is employed, a white-light-emitting element in which desired white balance is realized and a degree of deterioration with a driving time is improved can be obtained.

When a white-light-emitting element is manufactured using the structure of the light-emitting element 106 of this embodiment, blue light, red light, green light, and blue light may be emitted from the first layer, the second layer, the third layer, and the fourth layer, respectively. In other words, the peak wavelength of light emitted from the first layer may be in the range of 400 nm to 480 nm, the peak wavelength of light emitted from the second layer may be in the range of 580 nm to 700 nm, the peak wavelength of light emitted from the third layer may be in the range of 490 nm to 560 nm, and the peak wavelength of light emitted from the fourth layer may be in the range of 400 nm to 480 nm. In the emission spectrum of the light-emitting element 106, at least one peak is observed in each of the wavelength regions of those colors.

Note that the structure of the light-emitting element 106 in this embodiment is quite effective to be used when the cathode 101 serves as a reflective electrode and light is extracted through the anode 100. In this structure, the layer which emits light with a long wavelength (the second layer 103) is located away from the reflective electrode as far as possible; therefore, amplification and color purity improvement effect due to reflection can be effectively obtained. For a similar reason, the third layer 104 is provided between the reflective electrode and the second layer 103 and the fourth layer 105 is provided between the reflective electrode and the third layer 104.

Embodiment 2

Figure 1B:
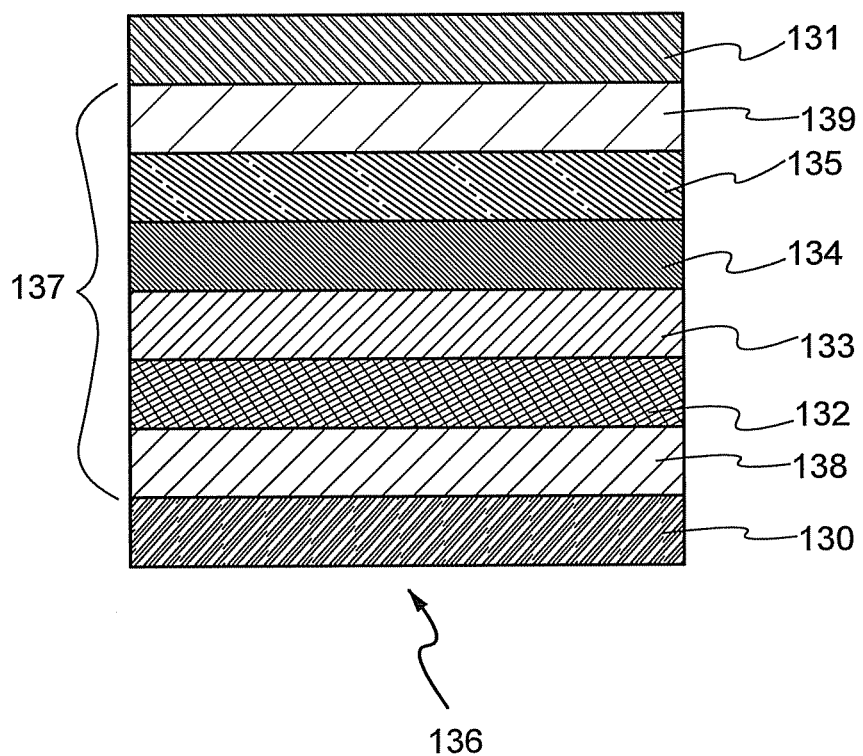

In this embodiment, a light-emitting element having a structure different from a structure in Embodiment 1 is described with reference to FIG. 1B. A layer 137 including an organic compound is provided between an anode 130 and a cathode 131. The layer 137 including an organic compound at least includes a layer serving as a light-emitting layer in which a first layer 132, a second layer 133, a third layer 134, and a fourth layer 135 are stacked in that order over the anode 130. In addition, a functional layer 138 may be provided between the layer serving as a light-emitting layer and the anode 130, and a functional layer 139 may be provided between the layer serving as a light-emitting layer and the cathode 131 as appropriate. The functional layer 138 is, for example, a hole-transporting layer and/or a hole-injecting layer, and the functional layer 139 is, for example, an electron-injecting layer and/or an electron-transporting layer. Note that the layer 137 including an organic compound should include at least the layer serving as a light-emitting layer in which the first layer 132, the second layer 133, the third layer 134, and the fourth layer 135 are stacked, and the functional layers 138 and 139 are not always necessary. Further, the functional layers 138 and 139 may be a single layer or a stacked layer. Further, the first layer 132 includes a first light-emitting substance, the second layer 133 includes a second light-emitting substance, the third layer 134 includes a third light-emitting substance, and the fourth layer 135 includes a fourth light-emitting substance. The first light-emitting substance and the fourth light-emitting substance included in the first layer 132 and the fourth layer 135, respectively, emit light of the same color. Note that it is preferable that the first light-emitting substance and the fourth light-emitting substance included in the first layer 132 and the fourth layer 135, respectively, be the same light-emitting substance.

Here, peak wavelengths of light emitted from the first light-emitting substance and the fourth light-emitting substance are in a shorter wavelength region than a peak wavelength of light emitted from the second light-emitting substance, and the peak wavelength of light emitted from the second light-emitting substance is in a shorter wavelength region than a peak wavelength of light emitted from the third light-emitting substance. In a case where the first light-emitting substance to the fourth light-emitting substance are fluorescent substances, a substance with the largest energy gap among the first light-emitting substance to the fourth light-emitting substance is used as the first light-emitting substance and the fourth light-emitting substance, whereas a substance with the smallest energy gap among them is used as the third light-emitting substance. In a case where the first light-emitting substance to the fourth light-emitting substance are phosphorescent substances, a substance which has the largest energy gap between the ground state and the triplet excited state (the triplet energy) among the first light-emitting substance to the fourth light-emitting substance is used as the first light-emitting substance and the fourth light-emitting substance, whereas a substance with the smallest triplet energy among them is used as the third light-emitting substance. Note that as described above, the first light-emitting substance and the fourth light-emitting substance emit light of the same color, and therefore, have approximately the same energy gap or triplet energy. Accordingly, the substance with the largest energy gap among the first light-emitting substance to the fourth light-emitting substance is used as both of the first light-emitting substance and the fourth light-emitting substance. However, in that case, it is needless to say that the two light-emitting substances are not necessarily have exactly the same energy gap and it is acceptable as long as they have substantially the same energy gap. This is also the case for a triplet energy. Further, in a case where a fluorescent substance and a phosphorescent substance are both used as the first light-emitting substance to the fourth light-emitting substance, the same consideration is applicable.

In addition, the first layer 132 has a hole-transporting property and the second layer 133 to fourth layer 135 have an electron-transporting property. Accordingly, holes and electrons are recombined with each other in the vicinity of the interface between the first layer 132 and the second layer 133, and thus light is emitted from the first light-emitting substance included in the first layer 132 and the second light-emitting substance included in the second layer 133. The third light-emitting substance included in the third layer 134 emits light due to energy transfer from the second layer 133. Here, holes which do not contribute to the recombination in the vicinity of the first layer 132 and the second layer 133 are captured in the fourth layer 135 and the fourth light-emitting substance in the fourth layer 135 emits light, whereby the light-emission efficiency is improved. Therefore, light obtained from the light-emitting element 136 has a spectrum in which spectra of light emitted from each of the first light-emitting substance, the second light-emitting substance, the third light-emitting substance, and the fourth light-emitting substance are superimposed.

Further, when holes which pass though a layer serving as a light-emitting layer reach an electron-transporting layer which is provided between the layer serving as a light-emitting layer and the cathode 131, a deterioration in luminance with a driving time occur. On the other hand, the light-emitting element 136 of this embodiment is provided with the fourth layer 135; therefore, the number of holes reaching the electron-transporting layer is reduced and a degree of deterioration can be lowered.

Further, an excitation energy of a light-emitting substance has the property of transferring from a substance with high energy to a substance with low energy. Therefore, when a recombination region is provided in the vicinity of the interface between the first layer 132 and the second layer 133, the excitation energy of the first light-emitting substance included in the first layer 132 may transfer to the second light-emitting substance included in the second layer 133, which may make the light-emission color difficult to adjust and a desired intense of light with a short wavelength particularly difficult to obtain. However, in the light-emitting element of this embodiment, which is provided with the fourth layer 135 including the fourth light-emitting substance, holes which do not contribute to recombination are recombined in the fourth layer 135, whereby light is emitted from the fourth light-emitting substance. Thus, light with a short wavelength can be easily obtained. Accordingly, with the structure of the light-emitting element of this embodiment, a light-emitting element with a desired light-emission color can be easily obtained.

Note that as long as the first layer 132 to the fourth layer 135 have the transporting property mentioned above, they may be either a light-emitting layer so-called light-emitting substance layer which includes a light-emitting substance as its main component or a light-emitting layer of a so-called host-guest type in which a light-emitting substance is dispersed in a host material having an energy gap (or a triplet energy) larger than the light-emitting substance. Further, both of the two kinds of light-emitting layers may be used as the first layer 132 to the fourth layer 135. For example, a light-emitting substance layer may be employed as the first layer 132 and light-emitting layers of a host-guest type may be employed as the second layer 133 to the fourth layer 135. In the host-guest type light-emitting layer, the transporting property of the layer generally depends on the transporting property of the host, which is the main component of the layer. Note that in the case of employing a host-guest type light-emitting layer, the rate of the light-emitting substance in the layer is preferably equal to or greater than 0.1 wt % and less than 50 wt %.

Here, since the first layer 132 has a hole-transporting property and the second layer 133 to fourth layer 135 has an electron-transporting property in the light-emitting element 136 of this embodiment, in a case where the first layer 132 is a light-emitting substance layer and the second layer 133 to the fourth layer 135 are light-emitting layers in which the second light-emitting substance to the fourth light-emitting substance are dispersed in the second organic compound to the fourth organic compound, respectively; the first light-emitting substance may have a hole-transporting property and the second organic compound to the fourth organic compound may have an electron-transporting property. When a structure in which the first layer 132 also is a light-emitting layer of a host-guest type in which the first light-emitting substance is dispersed in the first organic compound is employed as an alternative to the above-described structure of the light-emitting element, the first organic compound may have a hole-transporting property and the second organic compound to the fourth organic compound may have an electron-transporting property.

As a substance suitable for a host material in which a light-emitting substance is dispersed, there is a condensed polycyclic material such as a condensed polycyclic aromatic compound typified by an anthracene derivative. Such a material has a large band gap; thus, excitation energy is difficult to transfer from a light-emitting substance and decrease in light-emission efficiency or a deterioration of color purity is not easily caused. Moreover, such a material has either an electron-transporting property or a hole-transporting property depending on its substituent, and can be applied to light-emitting elements with various structures. However, in some cases, since a condensed polycyclic material having a high electron-transporting property is also capable of transporting holes to some extent, effects of deterioration due to holes passing through the light-emitting layer are increased depending on conditions. In such a case, by using the structure of the light-emitting element 106 of this embodiment, deterioration can be effectively suppressed. Note that as the condensed polycyclic material which is used as a host material, tricyclic to hexacyclic condensed aromatic compounds are especially effective to be used.

Note that the above-described structure of the light-emitting element 136 of this embodiment is also very effective in obtaining white light emission. When the structure of the light-emitting element 136 of this embodiment is employed, a white-light-emitting element in which desired white balance is realized and a degree of deterioration with a driving time is improved can be obtained.

When a white-light-emitting element is manufactured using the structure of the light-emitting element 136 of this embodiment, blue light, green light, red light, and blue light may be emitted from the first layer, the second layer, the third layer, and the fourth layer, respectively. In other words, the peak wavelength of light emitted from the first layer may be in the range of 400 nm to 480 nm, the peak wavelength of light emitted from the second layer may be in the range of 490 nm to 560 nm, the peak wavelength of light emitted from the third layer may be in the range of 580 nm to 700 nm, and the peak wavelength of light emitted from the fourth layer may be in the range of 400 nm to 480 nm. In the emission spectrum of the light-emitting element 136, at least one peak is observed in each of the wavelength regions of those colors.

Note that the structure of the light-emitting element 136 in this embodiment is quite effective to be used when the anode 130 serves as a reflective electrode and light is extracted through the cathode 131. In this structure, the layer which emits light with a long wavelength (the third layer 134) is located away from the reflective electrode as far as possible; therefore, amplification and color purity improvement effect due to reflection can be effectively obtained. For a similar reason, the second layer 133 is provided between the reflective electrode and the third layer 134 and the first layer 132 is provided between the reflective electrode and the second layer 133.

Embodiment 3

Next, Embodiment 3 is described. In this embodiment, the light-emitting elements in Embodiment 1 and Embodiment 2 and a method for manufacturing the light-emitting elements are described in specific. Note that an element structure and a manufacturing method described here are just an example, and other known structures, materials, and manufacturing methods can be applied within the scope of the present invention. Although this embodiment is described using the light-emitting element described in Embodiment 1 as an example, this embodiment can also be described using the light-emitting element described in Embodiment 2.

FIG. 1A schematically shows an example of an element structure of a light-emitting element of this embodiment. The light-emitting element shown in FIG. 1A has a structure in which the layer 107 including an organic compound is provided between the anode 100 and the cathode 101. The layer 107 including an organic compound at least includes a layer serving as a light-emitting layer which is a stacked structure in which the first layer 102, the second layer 103, the third layer 104, and the fourth layer 105 are stacked in that order over the anode 100. In addition, the functional layer 108 may be provided between the layer serving as a light-emitting function and the anode 100, and the functional layer 109 may be provided between the layer serving as a light-emitting layer and the cathode 101 as appropriate. The functional layer 108 is, for example, a hole-transporting layer and/or a hole-injecting layer, and the functional layer 109 is, for example, an electron-injecting layer and/or an electron-transporting layer. Note that in this specification, an anode refers to an electrode which injects holes into the layer including an organic compound and a cathode refers to an electrode which injects electrons into the layer including an organic compound.

First, the anode is formed over an insulating surface. For the anode, a metal, alloy, conductive compound, mixture thereof, or the like which has a high work function (specifically, of 4.0 eV or higher) is preferably used. Specifically, for example, indium tin oxide (hereinafter, referred to as ITO), indium tin oxide containing silicon or silicon oxide, indium oxide containing zinc oxide (ZnO), or indium oxide containing tungsten oxide and zinc oxide (IWZO) is given. Films of those conductive metal oxides are generally formed by sputtering, but they may be formed by a sol-gel method or the like. For example, a indium oxide film containing zinc oxide (ZnO) can be formed by a sputtering method using a target in which zinc oxide is added to indium oxide at 1 wt % to 20 wt %. An indium oxide fim containing tungsten oxide and zinc oxide (IWZO) can be formed by a sputtering method using a target in which tungsten oxide and zinc oxide are added to indium oxide at 0.5 wt % to 5 wt % and 0.1 wt % to 1 wt %, respectively. Further, gold (Au), platinum (Pt), nickel (Ni), tungsten (W), chromium (Cr), molybdenum (Mo), iron (Fe), cobalt (Co), copper (Cu), palladium (Pd), a nitride of a metal material (e.g., titanium nitride), or the like can be used.

Subsequently, the layer including an organic compound is formed. For the layer 107 including an organic compound, either a low molecular material or a high molecular material can be used. Note that the material forming the layer 107 including an organic compound is not limited to a material containing only an organic compound material, and a material which contains an inorganic compound may be used. In addition, the layer 107 including an organic compound generally includes an appropriate combination of functional layers, such as a hole-injecting layer, a hole-transporting layer, a hole-blocking layer, a light-emitting layer, an electron-transporting layer, and an electron-injecting layer. The layer 107 including an organic compound may include a layer having two or more functions of the above layers. Further, it is not necessary for the layer 107 including an organic compound to include all the above layers. It is needless to say that a layer other than the aforementioned functional layers may be provided. This embodiment is desdcribed using a light-emitting element, as an example, in which the layer 107 including an organic compound is a stacked structure including a hole-injecting layer, a hole-transporting layer, a layer having a light-emitting function (the layer having a light-emitting function is a stacked structure including the first layer 102, the second layer 103, the third layer 104, and the fourth layer 105), an electron-transporting layer, and an electron-injecting layer in that order over the anode.

When a hole-injecting layer is employed, a metal oxide such as vanadium oxide, molybdenum oxide, ruthenium oxide, or aluminum oxide can be used as a material for the hole-injecting layer. Alternatively, a porphyrin-based compound is effective to be used among organic compounds, and phthalocyanine (abbreviation: $H_2Pc$), copper phthalocyanine (abbreviation: CuPc), or the like can be used. As a hole-injecting layer, a high molecular compound (such as an oligomer, a dendrimer, or a polymer) can be used. For example, a high molecular compound such as poly(N-vinylcarbazole) (abbreviation: PVK), poly(4-vinyltriphenylamine) (abbreviation: PVTPA), poly[N-(4-{N'[4-(4-diphenylamino)phenyl]phenyl-N'-phenylamino}phenyl)methacrylamide] (abbreviation: PTPDMA), or poly[N,N'-bis(4-butylphenyl)-N,N'-bis(phenyl)benzidine] (abbreviation: Poly-TPD) can be used. Further, a high molecular compound doped with acid such as poly(3,4-ethylenedioxythiophene)/poly(styrenesulfonic acid) (PEDOT/PSS) or polyaniline/poly(styrenesulfonic acid) (PAni/PSS) can be used. The hole-injecting layer is formed to be in contact with the anode and by providing the hole-injecting layer, a barrier to injected carriers can be lowered and carriers are efficiently injected into a layer serving as a light-emitting layer, which leads to a reduction in drive voltage.

Alternatively, for the hole-injecting layer, a material in which an acceptor material is contained in a substance having a hole-transporting property (hereinafter, the material is referred to as a composite material) can be used. Note that by using a substance with a high hole-transporting property containing an acceptor substance, since the substance can have an ohmic contact with an electrode, a material used for the electrode may be selected regardless of its work function. In other words, besides a material with a high work function, a material with a low work function may also be used for the anode. As the acceptor substance, 7,7,8,8-tetracyano-2,3,5,6-tetrafluoroquinodimethane (abbreviation: $F_4$-TCNQ), chloranil, or the like can be given. Further, a transition metal oxide is given. In addition, an oxide of metals that belong to Group 4 to Group 8 of the periodic table can be given. Specifically, vanadium oxide, niobium oxide, tantalum oxide, chromium oxide, molybdenum oxide, tungsten oxide, manganese oxide, and rhenium oxide are preferable to be used because they have a high electron-accepting property. Among them, molybdenum oxide is especially preferable because molybdenum oxide can be easily handled in that it is stable also in the atmosphere and has a low hygroscopic property.

Note that in the present specification, "composition" means not only a simple mixture of two materials but also a mixture of a plurality of materials in a condition where electric charge is mutually transferred among the materials.

As a substance with a high hole-transporting property used for the composite material, any of a variety of compounds such as an aromatic amine compound, a carbazole derivative, aromatic hydrocarbon, and a high molecular compound (such as an oligomer, a dendrimer, or a polymer) can be used. Note that a substance having a hole mobility of $10^{-6}$ cm$^2$/Vs or more is preferably used as a substance having a high hole-transporting property used for the composite material. However, any other material whose hole-transporting property is higher than its electron-transporting property may be used. Organic compounds that can be used for the composite material is specifically given below.

Examples of an aromatic amine compound which can be used for the composite material include 4,4'-bis[N-(1-naphthyl)-N-phenylamino]biphenyl (abbreviation: NPB or α-ND), N,N'-bis(4-methylphenyl)-N,N'-diphenyl-p-phenylenediamine (abbreviation: DTDPPA), 4,4'-bis[N-(4-diphenylaminophenyl)-N-phenylamino]biphenyl (abbreviation: DPAB), 4,4'-bis(N-{4-[N'-(3-methylphenyl)-N-phenylamino]phenyl}-N-phenylamino)biphenyl (abbreviation: DNTPD), and 1,3,5-tris[N-(4-diphenylaminophenyl)-N-phenylamino]benzene (abbreviation: DPA3B).

Examples of a carbazole derivative which can be used for the composite material specifically include 3-[N-(9-phenylcarbazol-3-yl)-N-phenylamino]-9-phenylcarbazole (abbreviation: PCZPCA1), 3,6-bis[N-(9-phenylcarbazol-3-yl)-N-phenylamino]-9-phenylcarbazole (abbreviation: PCzPCA2), and 3-[N-(1-naphthyl)-N-(9-phenylcarbazol-3-yl)amino]-9-phenylcarbazole (abbreviation: PCzPCN1).

In addition, examples of a carbazole derivative which can be used for the composite material include 4,4'-di(N-carbazolyl)biphenyl (abbreviation: CBP), 1,3,5-tris[4-(N-carbazolyl)phenyl]benzene (abbreviation: TCPB), 9-[4-(10-phenyl-9-anthryl)phenyl]-9H-carbazole (abbreviation: CZPA), and 1,4-bis[4-(N-carbazolyl)phenyl]-2,3,5,6-tetraphenylbenzene can be used.

Further, examples of aromatic hydrocarbon which can be used for the composite material include 2-tert-butyl-9,10-di(2-naphthyl)anthracene (abbreviation: t-BuDNA), 2-tert-butyl-9,10-di(1-naphthyl)anthracene, 9,10-bis(3,5-diphenylphenyl)anthracene (abbreviation: DPPA), 2-tert-butyl-9,10-bis(4-phenylphenyl)anthracene (abbreviation: t-BuDBA), 9,10-di(2-naphthyl)anthracene (abbreviation: DNA), 9,10-diphenylanthracene (abbreviation: DPAnth), 2-tert-butylanthracene (abbreviation: t-BuAnth), 9,10-bis(4-methyl-1-naphthyl)anthracene (abbreviation: DMNA), 9,10-bis[2-(1-naphthyl)phenyl]2-tert-butyl-anthracene, 9,10-bis[2-(1-naphthyl)phenyl]anthracene, 2,3,6,7-tetramethyl-9,10-di(1-naphthyl)anthracene, 2,3,6,7-tetramethyl-9,10-di(2-naphthyl)anthracene, 9,9'-bianthryl, 10,10'-diphenyl-9,9'-bianthryl, 10,10'-bis(2-phenylphenyl)-9,9'-bianthryl, 10,10'-bis[(2,3,4,5,6-pentaphenyl)phenyl]-9,9'-bianthryl, anthracene, tetracene, rubrene, perylene, and 2,5,8,11-tetra(tert-butyl)perylene. Besides, pentacene, coronene, or the like can be used. As described above, an aromatic hydrocarbon which has a hole mobility of $1 \times 10^{-6}$ cm$^2$/Vs or more and 14 to 42 carbon atoms is more preferable.

Note that the aromatic hydrocarbon which can be used for the composite material may have a vinyl skeleton. As examples of aromatic hydrocarbon having a vinyl group, 4,4'-bis(2,2-diphenylvinyl)biphenyl (abbreviation: DPVBi) and 9,10-bis[4-(2,2-diphenylvinyl)phenyl]anthracene (abbreviation: DPVPA) can be given.

Note that the hole-injecting layer can be formed using a composite material of the aforementioned high molecular compound, such as PVK, PVTPA, PTPDMA, or Poly-TPD, and the aforementioned acceptor substance.

When a composite material is used for the hole-injecting layer, any of a variety of metals, alloys, electrically conductive compounds, or mixture thereof can be used for the anode, regardless of a value of the work function. For example, aluminum (Al), silver (Ag), an aluminum alloy (e.g., AlSi), or the like can be used as the anode, in addition to the aforementioned materials. Moreover, any of the following materials having a low work function can be used: elements which belong to Group 1 and Group 2 of the periodic table, that is, alkali metals such as lithium (Li) and cesium (Cs) and alkaline-earth metals such as magnesium (Mg), calcium (Ca), and strontium (Sr), and alloys thereof (such as MgAg and AlLi); rare earth metals such as europium (Eu) and ytterbium (Yb), and alloys thereof, and the like. A film of an alkali metal, an alkaline earth metal, or an alloy thereof can be formed by a vacuum evaporation method. A film of an alloy containing an alkali metal or an alkaline earth metal can be formed by a sputtering method. Further, a film of a silver paste or the like can be formed by an ink-jet method or the like.

The hole-transporting layer can be formed using an appropriate material such as N,N'-bis(spiro-9,9'-bifluoren-2-yl)-N,N'-diphenylbenzidine (abbreviation: BSPB). 4,4'-bis[N-(1-naphthyl)-N-phenylamino]biphenyl (abbreviation: NPB or α-NPD), 4,4'-bis[N-(3-methylphenyl)-N-phenylamino]biphenyl (abbreviation: TPD), 4,4',4"-tris(N,N-diphenylamino)triphenylamine (abbreviation: TDATA), 4,4',4"-tris[N-(3-methylphenyl)-N-phenylamino]triphenylamine (abbreviation: MTDATA), 4,4'-bis{N-[4-(N,N-di-m-tolylamino)phenyl]-N-phenylamino}biphenyl (abbreviation: DNTPD), 1,3,5-tris[N,N-di(n-tolyl)amino]benzene (abbreviation: m-MTDAB), 4,4',4"-tris(N-carbazolyl)triphenylamine (abbreviation: TCTA), phthalocyanine (abbreviation: $H_2Pc$), copper phthalocyanine (abbreviation: CuPc), or vanadyl phthalocyanine (abbreviation: VOPc). The hole-transporting layer is preferably formed using a substance having a hole mobility of $10^{-6}$ $cm^2/Vs$ or more, but any other material whose hole-transporting property is higher than its electron-transporting property can be used. The hole-transporting layer may be formed with not only a single layer but also a multilayer of two or more layers formed of substances which satisfy the above condition. The hole-transporting layer can be formed by a vacuum evaporation method or the like.

For the hole-transporting layer, a high molecular compound such as PVK, PVTPA, PTPDMA, or Poly-TPD can be used. In this case, a solution process such as an inkjet method or a spin coating method can be employed.

Note that the hole-transporting layer which is in contact with the layer serving as a light-emitting layer preferably includes a substance having a higher excitation energy than the first light-emitting substance, which is a light-emission center substance of the first layer 102. Such a structure makes it possible to suppress energy transfer from the light-emitting layer to the hole-transporting layer and to suppress a reduction in light-emission efficiency.

The layer serving as a light-emitting layer includes the first layer 102, the second layer 103, the third layer 104, and the fourth layer 105, which are stacked over the anode 100. The first layer 102 to the third layer 104 have a hole-transporting property and the fourth layer 105 has an electron-transporting property. In this embodiment, the first layer is a light-emitting substance layer which is formed of only the first light-emitting substance and the second layer 103 to the fourth layer 105 are host-guest type light-emitting layers, which includes a light-emitting substance dispersed in a host material. It is needless to say that the structure of the light-emitting element of this embodiment is not limited to the structure. All of the first layer 102 to the fourth layer 105 may be either host-guest type light-emitting layers or light-emitting substance layers; or a light-emitting substance layer and a host-guest type light-emitting layer may be used as the first layer 102 to the fourth layer 105.

Note that as for a light-emitting substance layer, in the case where a state of the layer which only includes the light-emitting substance is unstable, the layer may contain an additive for stabilizing a fim quality. A film quality stabilizer is defined as follows: the rate (wt %) of the film quality stabilizer in the layer is lower than that of the light-emitting substance, and the energy gap (the triplet energy if the light-emitting substance emits phosphorescence) of the film quality stabilizer is lager than the light-emitting substance. Even when a layer includes a substance which satisfies those conditions in addition to the light-emitting substance, the layer can be regarded as a light-emitting substance layer in this embodiment.

In the light-emitting element of this embodiment, as described above, the first layer includes the first light-emitting substance; the second layer includes the second light-emitting substance and the second organic compound, which is a host material in which the second light-emitting substance is dispersed; the third layer includes the third light-emitting substance and the third organic compound, which is a host material in which the third light-emitting substance is dispersed; and the fourth layer includes the fourth light-emitting substance and the fourth organic compound, which is a host material in which the fourth light-emitting substance is dispersed. In a host-guest type light-emitting layer, the rate of the light-emitting substance may be equal to or greater than 0.1 wt % and less than 50 wt %. The light-emitting layer can be formed by a vacuum evaporation method or by a co-evaporation method, in which different materials are evaporated at the same time.

The first light-emitting substance to the fourth light-emitting substance serve as light emission centers. In the case of manufacturing the light-emitting element described in Embodiment 1, the substances are selected so that the peak wavelengths of light emitted from the first light-emitting substance and the fourth light-emitting substance are shorter than that of light emitted from the third light-emitting substance and the peak wavelength of light emitted from the third light-emitting substance is shorter than that of the light emitted from the second light-emitting substance. In the case of manufacturing the light-emitting element described in Embodiment 2, the substances are selected so that the peak wavelengths of light emitted from the first light-emitting substance and the fourth light-emitting substance are shorter than that of light emitted from the second light-emitting substance and the peak wavelength of light emitted from the second light-emitting substance is shorter than that of the light emitted from the third light-emitting substance.

The first layer is a layer having a hole-transporting property; therefore, a substance having a hole-transporting property is selected as the first light-emitting substance. Note that when the first layer is a host-guest type light-emitting layer, a transporting property is not necessarily taken into consideration in selection of the first light-emitting substance. In a similar manner, when a light-emitting substance layer is employed as any or all of the second layer to the fourth layer, it is important that the light-emitting substance be selected in consideration of not only the relation of wavelengths of light emission but the transporting property to be required in each of layers.

Examples of the substance which can be used as the first light-emitting substance to the fourth light-emitting substance are given below without limitation. As fluorescent materials, in addition to N,N-bis[4-(9H-carbazol-9-yl)phenyl]-N-diphenylstilbene-4,4'-diamine (abbreviation: YGA2S) and 4-(9H-carbazol-9-yl)-4'-(10-phenyl-9-anthryl)triphenylamine (abbreviation: YGAPA), there are fluorescent emitting materials with an emission peak equal to or greater than 450 nm, such as 4-(9H-carbazol-9-yl)-4'-(9,10-diphenyl-2-anthryl)triphenylamine (abbreviation: 2YGAPPA), N,9-diphenyl-N-[4-(10-phenyl-9-anthryl)phenyl]-9H-carbazol-3-amine (abbreviation: PCAPA), perylene, 2,5,8,11-tetra-tert-butylperylene (abbreviation: TBP), 4-(10-phenyl-9-anthryl)-4'-(9-phenyl-9H-carbazol-3-yl)triphenylamine (abbreviation: PCBAPA), N,N'-(2-tert-butylanthracene-9,10-diyldi-4,1-phenylene) bis[N,N',N'-triphenyl-1,4-phenylenediamine] (abbreviation: DPABPA), N,9-diphenyl-N-[4-(9,10-diphenyl-2-anthryl)phenyl]-9H-carbazol-3-amine (abbreviation: 2PCAPPA), N-[4-(9,10-diphenyl-2-anthryl)phenyl]-N,N',N'-triphenyl-1,4-phenylenediamine (abbreviation: 2DPAPPA), N,N,N',N',N'',N''',N'''-octaphenyldibenzo[g,p]chrysene-2,7,10,15-tetraamine (abbreviation: DBC1), coumarin 30, N-(9,10-diphenyl-2-anthryl)-N,9-diphenyl-9H-carbazol-3-amine (abbreviation: 2PCAPA), N-[9,10-bis(1,1'-biphenyl-2-yl)-2-anthryl]-N,9-diphenyl-9H-carbazol-3-amine (abbreviation: 2PCABPhA), N-(9,10-diphenyl-2-anthryl)-N,N',N'-triphenyl-1,4-phenylenediamine (abbreviation: 2DPAPA), N-[9,10-bis(1,1'-biphenyl-2-yl)-2-anthryl]-N,N',N'-triphenyl-1,4-phenylenediamine (abbreviation: 2DPABPhA), 9,10-bis(1,1'-biphenyl-2-yl)-N-[4-(9H-carbazol-9-yl)phenyl]-N-phenylanthracen-2-amine (abbreviation: 2YGABPhA), N,N,9-triphenylanthracen-9-amine (abbreviation: DPhAPhA), coumarin 545T, N,N'-diphenylquinacridone (abbreviation: DPQd), rubrene, 5,12-bis(1,1'-biphenyl-4-yl)-6,11-diphenyltetracene (abbreviation: BPT), 2-(2-{2-[4-(dimethylamino)phenyl]ethenyl}-6-methyl-4H-pyran-4-ylidene)propanedinitrile (abbreviation: DCM1), 2-{methyl-6-[2-(2,3,6,7-tetrahydro-1H,5H-benzo[ij]quinolizin-9-yl)ethenyl]-4H-pn-4-ylidene}propanedinitrile (abbreviation: DCM2), N,N,N',N'-tetrakis(4-methylphenyl)tetracene-5,11-diamine (abbreviation: p-mPhTD), 7,13-diphenyl-N,N,N'N'-tetrakis(4-methylphenyl)acenaphtho[1,2-α]fluoranthene-3,10-diamine (abbreviation: p-mPhAFD), 2-{2-isopropyl-6-[2-(1,1,7,7-tetramethyl-2,3,6,7-tetrahydro-1H,5H-benzo[ij]quinolizin-9-yl)ethenyl]-4H-pyran-4-ylidene}propanedinitrile (abbreviation: DCJTI), 2-{2-tert-butyl-6-[2-(1,1,7,7-tetramethyl-2,3,6,7-tetrahydro-1H,5H-benzo[ij]quinolizin-9-yl)ethenyl]-4H-pyran-4-ylidene}propanedinitrile (abbreviation: DCJTB), 2-(2,6-bis{2-[4-(dimethylamino)phenyl]ethenyl}-4H-pyran-4-ylidene)propanedinitrile (abbreviation: BisDCM), and 2-{2,6-bis[2-(8-methoxy-1,1,7,7-tetramethyl-2,3,6,7-tetrahydro-1H,5H-benzo[i]quinolizin-9-yl)ethenyl]-4H-pyran-4-ylidene}propanedinitrile (abbreviation: BisDCJTM). As phosphorescent materials, in addition to bis[2-(4',6'-difluorophenyl)pyridinato-N,C$^{2'}$]iridium(III)tetrakis(1-pyrazolyl)borate (abbreviation: FIr6), there are phosphorescent materials with an emission wavelength in the range of 470 nm to 500 nm, such as bis[2-(4',6'-difluorophenyl)pyridinato-N,C$^{2'}$]iridium(III)picolinate (abbreviation: FIrpic), bis[2-(3',5'bistrifluoromethylphenyl)pyridinato-N,C$^{2'}$]iridium(III)picolinate (abbreviation: Ir(CF$_3$ppy)$_2$(pic)), and bis[2-(4',6'-difluorophenyl)pyridinato-N,C$^{2'}$]iridium(III)acetylacetonate (abbreviation: FIracac); phosphorescent materials with an emission wavelength equal to or greater than 500 nm (materials which emit green light), such as tris(2-phenylpyridinato)iridium(II) (abbreviation: Ir(ppy)$_3$), bis(2-phenylpyridinato)iridium(III)acetylacetonate (abbreviation: Ir(ppy)$_2$(acac)), bis(1,2-diphenyl-1H-benzimidazolato)iridium(III) acetylacetonate (abbreviation: Ir(pbi)$_2$(acac)), tris(acetylacetonato)(monophenanthroline)terbium(III) (abbreviation: Tb(acac)$_3$(Phen)), bis(benzo[h]quinolinato)iridium(III)acetylacetonate (abbreviation: Ir(bzq)$_2$(acac)), bis(2,4-diphenyl-1,3-oxazolato-N,C$^{2'}$)iridium(III)acetylacetonate (abbreviation: Ir(dpo)$_2$(acac)), bis[2-(4'-perfluorophenylphenyl)pyridinato]iridium(III)acetylacetonate (abbreviation: Ir(p-PF-ph)$_2$(acac)), bis(2-phenylbenzothiazolato-N,C$^{2'}$)iridium(III)acetylacetonate (abbreviation: Ir(bt)$_2$(acac)), bis[2-(2'-benzo[4,5-α]thienyl)pyridinato-N,C$^{3'}$]iridium(III)acetylacetonate (abbreviation: Ir(btp)$_2$(acac)), bis(1-phenylisoquinolinato-N,C$^{2'}$)iridium(II)acetylacetonate (abbreviation: Ir(piq)$_2$(acac)), (acetylacetonato)bis[2,3-bis(4-fluorophenyl)quinoxalinato]iridium (III) (abbreviation: Ir(Fdpq)$_2$(acac)), (acetylacetonato)bis(2,3,5-triphenylpyrazinato)iridium(III) (abbreviation: Ir(tppr)$_2$(acac)), 2,3,7,8,12,13,17,18-octaethyl-21H,23H-porphyrinatoplatinum(II) (abbreviation: PtOEP), tris(1,3-diphenyl-1,3-propanedionato)(monophenanthroline)europium(III) (abbreviation: Eu(DBM)$_3$(Phen)), and tris[1-(2-thenoyl)-3,3,3-trifluoroacetonato](monophenanthroline)europium(III) (abbreviation: Eu(TTA)$_3$(Phen)). The first light-emitting substance to the fourth light-emitting substance may be selected from the above materials or other known materials in consideration of a relation among light-emission colors (or peak wavelengths of light emission) of light-emitting layers and also in consideration of a transporting property when the layer is a light-emitting substance layer.

As examples of an organic compound which can be used as the second organic compound to the fourth organic compound, which are host materials in which the light-emitting substances are dispersed in the second layer 102 to the fourth layer 105, the following can be given: metal complexes such as tris(8-quinolinolato)aluminum(III) (abbreviation: Alq), tris(4-methyl-8-quinolinolato)aluminum(III) (abbreviation: Almq$_3$), bis(10-hydroxybenzo[h]quinolinato)beryllium(II) (abbreviation: BeBq$_2$), bis(2-methyl-8-quinolinolato)(4-phenylphenolato)aluminum(III) (abbreviation: BAlq), bis(8-quinolinolato)zinc(II) (abbreviation: Znq), bis[2-(2-benzoxazolyl)phenolato]zinc(II) (abbreviation: ZnPBO), and bis[2-(2-benzothiazolyl)phenolato]zinc(II) (abbreviation: ZnBTZ); heterocyclic compounds such as 2-(4-biphenylyl)-5-(4-tert-butylphenyl)-1,3,4-oxadiazole (abbreviation: PBD), 1,3-bis[5-(p-tert-butylphenyl)-1,3,4-oxadiazol-2-yl]benzene (abbreviation: OXD-7), 3-(4-biphenylyl)-4-phenyl-5-(4-tert-butylphenyl)-1,2,4-triazole (abbreviation: TAZ), 2,2',2''-(1,3,5-benzenetriyl)-tris(1-phenyl-1H-benzimidazole) (abbreviation: TPBI), bathophenanthroline (abbreviation: BPhen), bathocuproine (abbreviation: BCP), and 9-[4-(5-phenyl-1,3,4-oxadiazol-2-yl)phenyl]-9H-carbazole (abbreviation: CO11); and aromatic amine compounds such as NPB (or α-NPD), TPD, and BSPB. In addition, condensed polycyclic aromatic compounds such as anthracene derivatives, phenanthrene derivatives, pyrene derivatives, chrysene derivatives, and dibenzo[g,p]chrysene derivatives are given. Specific examples of the condensed polycyclic aromatic compound include 9,10-diphenylanthracene (abbreviation: DPAnth), N,N-diphenyl-9-[4-(10-phenyl-9-anthryl)phenyl]-9H-carbazol-3-amine (abbreviation: CzA1PA), 4-(10-phenyl-9-anthryl)triphenylamine (abbreviation: DPhPA), 4-(9H-carbazol-9-yl)-4'-(10-phenyl-9-anthryl)triphenylamine (abbreviation: YGAPA), N,9-diphenyl-N-[4-(10-phenyl-9-anthryl)phenyl]-9H-carbazol-3-amine (abbreviation:

PCAPA), N,9-diphenyl-N-{4-[4-(10-phenyl-9-anthryl)phenyl]phenyl}-9H-carbazol-3-amine (abbreviation: PCAPBA), N,9-diphenyl-N-(9,10-diphenyl-2-anthryl)-9H-carbazol-3-amine (abbreviation: 2PCAPA), 6,12-dimethoxy-5,11-diphenylchrysene, N,N,N',N',N'',N''',N'''-octaphenyldibenzo[g,p]chrysene-2,7,10,15-tetramine (abbreviation: DBC1), 9-[4-(10-phenyl-9-anthryl)phenyl]-9H-carbazole (abbreviation: CZPA), 3,6-diphenyl-9-[4-(10-phenyl-9-anthryl)phenyl]-9H-carbazole (abbreviation: DPCZPA), 9,10-bis(3,5-diphenylphenyl)anthracene (abbreviation: DPPA), 9,10-di(2-naphthyl)anthracene (abbreviation: DNA), 2-tert-butyl-9,10-di(2-naphthyl)anthracene (abbreviation: t-BuDNA), 9,9'-bianthryl (abbreviation: BANT), 9,9'-(stilbene-3,3'-diyl)diphenanthrene (abbreviation: DPNS), 9,9'-(stilbene-4,4'-diyl)diphenanthrene (abbreviation: DPNS2), 3,3',3''-(benzene-1,3,5-triyl)tripyrene (abbreviation: TPB3), and the like. From those substances or other known substances, a substance may be selected which has a larger energy gap (or a triplet energy if the substance emits phosphorescence) than a light-emission center substance dispersed in the substance and which has the transporting property to be required.

Note that in the case of the light-emitting element described in Embodiment 1, a material having a hole-transporting property is selected as the second organic compound and the third organic compound and a material having an electron-transporting property is selected as the fourth organic compound. On the other hand, in the case of the light-emitting element described in Embodiment 2, a material having an electron-transporting property is selected as the second organic compound to the fourth organic compound. The first organic compound can be selected in a similar manner when the first layer is a host-guest type light-emitting layer, in which the first light-emitting substance is dispersed in the first organic compound. The first layer has a hole-transporting property both in the light-emitting elements of Embodiment 1 and Embodiment 2; therefore, a substance having a hole-transporting property may be selected as the first organic compound from the aforementioned substances or other known substances.

Note that as a material having a hole-transporting property, the following can be given: the aforementioned aromatic amine compounds and condensed polycyclic aromatic compounds such as DPAnth, CZA1PA, DPhPA, YGAPA, PCAPA, PCAPBA, 2PCAPA, and DBC1. As a material having an electron-transporting property, the following can be given: the aforementioned heterocyclic compounds and condensed polycyclic aromatic compounds such as CZPA, DPCzPA, DPPA, DNA, t-BuDNA, BANT, DPNS, DPNS2, and TPB3.

Among the aforementioned substances, the condensed polycyclic aromatic compounds particularly have a large band gap and can be suitably used as a host material in which a light-emission center substance is dispersed. However, even the condensed polycyclic aromatic compounds having a hole-transporting property are capable of transporting electrons to some extent. Accordingly, in some cases, electrons reach the hole-transporting layer between the layer serving as a light-emitting layer and the anode and promote deterioration. Therefore, in the case where DPAnth, CzAlPA, DPhPA, YGAPA, PCAPA, PCAPBA, 2PCAPA, DBC1, or the like, which is a condensed polycyclic aromatic compound having a hole-transporting property, is used as the first organic compound, the second organic compound, and the third organic compound, deterioration can be suppressed very effectively with the structure of the light-emitting element of this embodiment.

In the case of providing the electron-transporting layer between the layer serving as a light-emitting layer and the cathode, the electron-transporting layer is provided between the light-emitting layer and the electron-injecting layer. As a suitable material, a metal complex or the like which has a quinoline or benzoquinoline skeleton can be given, for example, tris(8-quinolinolato)aluminum (abbreviation: $Alq_3$), tris(4-methyl-8-quinolinolato)aluminum (abbreviation: $Almq_3$), bis(10-hydroxybenzo[h]-quinolinato)beryllium (abbreviation: $BeBq_2$), or bis(2-methyl-8-quinolinolato)(4-hydroxy-biphenyl)aluminum (abbreviation: BAlq) can be given. Alternatively, a metal complex or the like which has an oxazole-based ligand or a thiazole-based ligand, such as bis[2-(2-hydroxyphenyl)benzoxazolato]zinc (abbreviation: $Zn(BOX)_2$) or bis[2-(2-hydroxyphenyl)benzothiazolato]zinc (abbreviation: $Zn(BTZ)_2$) can be used. Besides a metal complex, 2-(4-biphenylyl)-5-(4-tert-butylphenyl)-1,3,4-oxadiazole (abbreviation: PBD), 1,3-bis[5-(p-tert-butylphenyl)-1,3,4-oxadiazol-2-yl]benzene (abbreviation: OXD-7), bathophenanthroline (abbreviation: BPhen), bathocuproine (abbreviation: BCP), or the like can be used. The electron-transporting layer is preferably formed using a substance having an electron mobility of $10^{-6}$ $cm^2/Vs$ or more, but any other material whose electron-transporting property is higher than its hole-transporting property can be used. The electron-transporting layer may be formed with not only a single layer but also a multilayer of two or more layers formed of substances which satisfy the above condition. The electron-transporting layer can be formed by a vacuum evaporation method or the like.

For the electron-transporting layer, a high molecular compound such as poly[(9,9-dihexylfluorene-2,7-diyl)-co-(pyridine-3,5-diyl)] (abbreviation: PF-Py) or poly[(9,9-dioctylfluorene-2,7-diyl)-co-(2,2'-bipyridine-6,6'-diyl)] (abbreviation: PF-BPy) can be used. In this case, a solution process such as an ink-jet method or a spin coating method can be employed.

Note that the electron-transporting layer which is in contact with the layer serving as a light-emitting layer preferably includes a substance having a higher excitation energy than the fourth light-emitting substance, which is a light-emission center substance of the fourth layer 105. Such a structure makes it possible to suppress energy transfer from the light-emitting layer to the electron-transporting layer and to achieve high light-emission efficiency.

When an electron-injecting layer is employed, there is no particular limitation on an electron-injecting material used for forming the electron-injecting layer. Specifically, an alkali metal compound or alkaline earth metal compound such as calcium fluoride, lithium fluoride, lithium oxide, or lithium chloride, or the like is preferable to be used. Alternatively, a layer in which a so-called electron-transporting material such as tris(8-quinolinolato)aluminum (abbreviation: $Alq_3$) or bathocuproine (abbreviation: BCP) is combined with an alkali metal or alkaline earth metal such as lithium or magnesium can be used. The electron-injecting layer is formed to be in contact with the cathode and by providing the electron-injecting layer, a barrier to an injected carrier can be lowered and carriers are efficiently injected into the layer serving as a light-emitting layer, which leads to a reduction in drive voltage. Note that it is more preferable that the electron-injecting layer be a layer in which a substance having an electron-transporting property is combined with an alkali metal or alkaline earth metal, because electron injection from the cathode efficiently proceeds in using such a layer. The electron-injecting layer can be formed by a vacuum evaporation method or the like.

Note that the layer 107 including an organic compound can be formed by either a wet process or a dry process, such as an evaporation method, an inkjet method, a spin coating method, or a dip coating method, as well as the aforementioned formation method.

Moreover, when the electron-injecting layer is provided between the cathode and the electron-transporting layer, any of a variety of conductive materials such as Al, Ag, ITO, and indium tin oxide containing silicon or silicon oxide can be used for the cathode, regardless of a valuve of its work function.

After that, the cathode is formed, whereby the light-emitting element is completed. Any of a variety of metals, alloys, electrically conductive compounds, or mixtures thereof which have a low work function (specifically, 3.8 eV or less) is preferably used. Specifically, any of the following materials can be used: metals which belong to Group 1 and Group 2 of the periodic table, that is, alkali metals such as lithium (Li) and cesium (Cs) and alkaline-earth metals such as magnesium (Mg), calcium (Ca), and strontium (Sr), and alloys thereof (such as MgAg and AlLi); rare earth metals such as europium (Eu) and ytterbium (Yb), and alloys thereof; and the like. A film of an alkali metal, an alkaline earth metal, or an alloy thereof can be formed by a vacuum evaporation method. A film of an alloy containing an alkali metal or an alkaline earth metal can alternatively be formed by a sputtering method. Further, a film of a silver paste or the like can be formed by an ink-jet method or the like.

Note that a conductive composition including a conductive high molecule (also referred to as a conductive polymer) can be used for the anode and the cathode. When a thin film of a conductive composition is formed as the anode or the cathode, the thin film preferably has a sheet resistance of 10000 Ω/square or less and light transmittance of 70% or higher with respect to light with a wavelength of 550 nm. Note that the resistivity of a conductive high molecule which is included in the thin film is preferably 0.1 Ω·cm or less.

As a conductive high molecule, a so-called π-electron conjugated high molecule can be used. For example, polyaniline and/or a derivative thereof, polypyrrole and/or a derivative thereof, polythiophene and/or a derivative thereof, and a copolymer of two or more kinds of those materials can be given.

Specific examples of a conjugated conductive high molecule are given below: polypyrrole, poly(3-methylpyrrole), poly(3-butylpyrrole), poly(3-octylpyrrole), poly(3-decylpyrrole), poly(3,4-dimethylpyrrole), poly(3,4-dibutylpyrrole), poly(3-hydroxypyrrole), poly(3-methyl-4-hydroxypyrrole), poly(3-methoxypyrrole), poly(3-ethoxypyrrole), poly(3-octoxypyrrole), poly(3-carboxylpyrrole), poly(3-methyl-4-carboxylpyrrole), poly(N-methylpyrrole), polythiophene, poly(3-methylthiophene), poly(3-butylthiophene), poly(3-octylthiophene), poly(3-decylthiophene), poly(3-dodecylthiophene), poly(3-methoxythiophene), poly(3-ethoxythiophene), poly(3-octoxythiophene), poly(3-carboxylthiophene), poly(3-methyl-4-carboxylthiophene), poly(3,4-ethylenedioxythiophene), polyaniline, poly(2-methylaniline), poly(2-octylaniline), poly(2-isobutylaniline), poly(3-isobutylaniline), poly(2-anilinesulfonic acid), and poly(3-anilinesulfonic acid).

The aforementioned conductive high molecular compounds can be used alone for the anode or the cathode, or an organic resin is added to the conductive high molecular compound in order to adjust film characteristics such that it can be used as a conductive composition.

As for an organic resin, a thermosetting resin, a thermoplastic resin, or a photocurable resin may be used as long as such a resin is compatible to a conductive high molecule or such a resin can be mixed with and dispersed into a conductive high molecule. For example, a polyester-based resin such as polyethylene terephthalate, polybutylene terephthalate, or polyethylene naphthalate; a polyimide-based resin such as polyimide or polyimide amide; a polyamide resin such as polyamide 6, polyamide 6,6, polyamide 12, or polyamide 11; a fluorine resin such as polyvinylidene fluoride, polyvinyl fluoride, polytetrafluoroethylene, ethylenetetrafluoroethylene copolymer, or polychlorotrifluoroethylene; a vinyl resin such as polyvinyl alcohol, polyvinyl ether, polyvinyl butyral, polyvinyl acetate, or polyvinyl chloride; an epoxy resin; a xylene resin; an aramid resin; a polyurethane-based resin; a polyurea-based resin; a melamine resin; a phenol-based resin; polyether; an acrylic-based resin; or a copolymer of any of those resins can be given.

Furthermore, the conductive high molecule or conductive composition may be doped with an acceptor dopant or a donor dopant so that oxidation-reduction potential of a conjugated electron in the conductive high-molecule may be changed in order to adjust conductivity of the conductive high molecule or conductive composition.

As the acceptor dopant, a halogen compound, an organic cyano compound, an organometallic compound, or the like can be used. As examples of a halogen compound, chlorine, bromine, iodine, iodine chloride, iodine bromide, and iodine fluoride can be given. As an organic cyano compound, a compound in which two or more cyano groups are included in a conjugated bond can be used; for example, tetracyanoethylene, tetracyanoethylene oxide, tetracyanobenzene, tetracyanoquinodimethane, and tetracyanoazanaphthalene are given. Further, as an acceptor dopant, phosphorus pentafluoride, arsenic pentafluoride, antimony pentafluoride, boron trifluoride, boron trichloride, or boron tribromide; or an inorganic acid such as hydrochloric acid, sulfuric acid, nitric acid, phosphoric acid, fluoroboric acid, or hydrofluoric acid; or an organic acid such as organic carboxylic acid or organic sulfonic acid can be used. As an organic carboxylic acid and an organic sulfonic acid, the aforementioned carboxylic acid compound and sufonic acid compound can be used.

As the donor dopant, an alkali metal, an alkaline earth metal, a tertiary amine compound, and the like can be given.

A thin film used as the anode or the cathode can be formed by a wet process using a solution in which any of the aforementioned conductive high molecules or conductive compositions is dissolved in water or an organic solvent (for example, an alcohol-based solvent, a ketone-based solvent, an ester-based solvent, a hydrocarbon-based solvent, or an aromatic-based solvent).

The solvent for dissolving the aforementioned conductive high molecule or conductive composition is not particularly limited. A solvent which dissolves the aforementioned conductive high molecule and polymer resin compound such as an organic resin may be used. For example, the conductive high molecule and polymer resin compound may be dissolved in a single solvent or a mixed solvent of any of water, methanol, ethanol, propylene carbonate, N-methylpyrrolidone, dimethylformamide, dimethylacetamide, cyclohexanone, acetone, methyl ethyl ketone, methyl isobutyl ketone, toluene, and the like.

A film of the conductive composition can be formed by a wet process such as an application method, a coating method, a droplet discharge method (also referred to as "an ink-jet method"), or a printing method after the conductive composition is dissolved in a solvent. The solvent may be removed with thermal treatment or may be removed under reduced pressure. In the case where the organic resin is a thermosetting resin, thermal treatment may be further performed. In the case where the organic resin is a photocurable resin, light irradiation treatment may be performed.

Embodiment 4

In this embodiment, an example of a light-emitting device manufactured using the light-emitting element described in any of Embodiments 1 to 3 will be described. Note that the light-emitting device according to the present invention is not limited to a light-emitting device described below, and it includes, in its category, all light-emitting devices whose display portion (a pixel portion 602 of FIGS. 3A and 3B in this embodiment) includes the light-emitting element described in any of Embodiments 1 to 3.

Figure 3A:
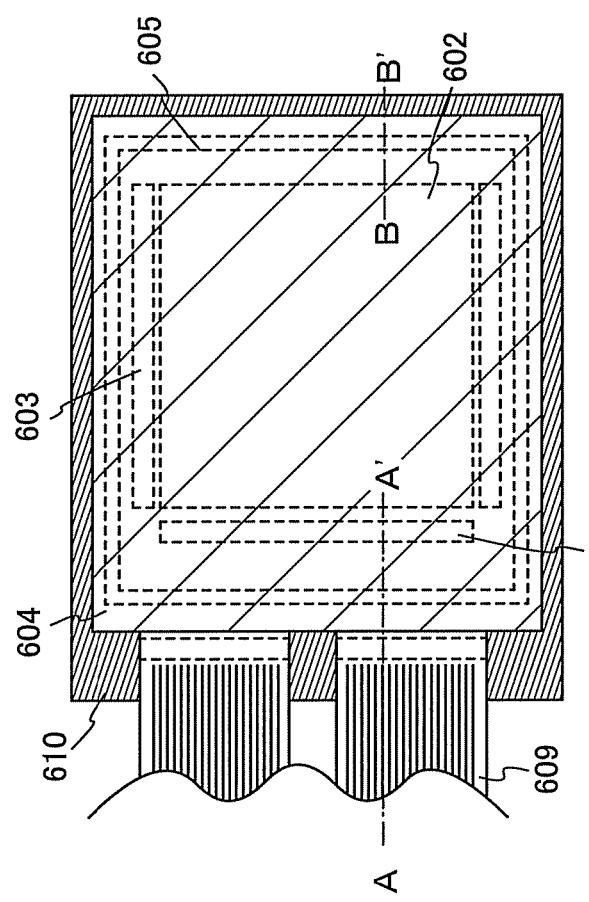
FIG. 3A is a top view and FIG. 3B is a cross-sectional view of a light-emitting device according to one embodiment of the present invention.
Figure 3B:
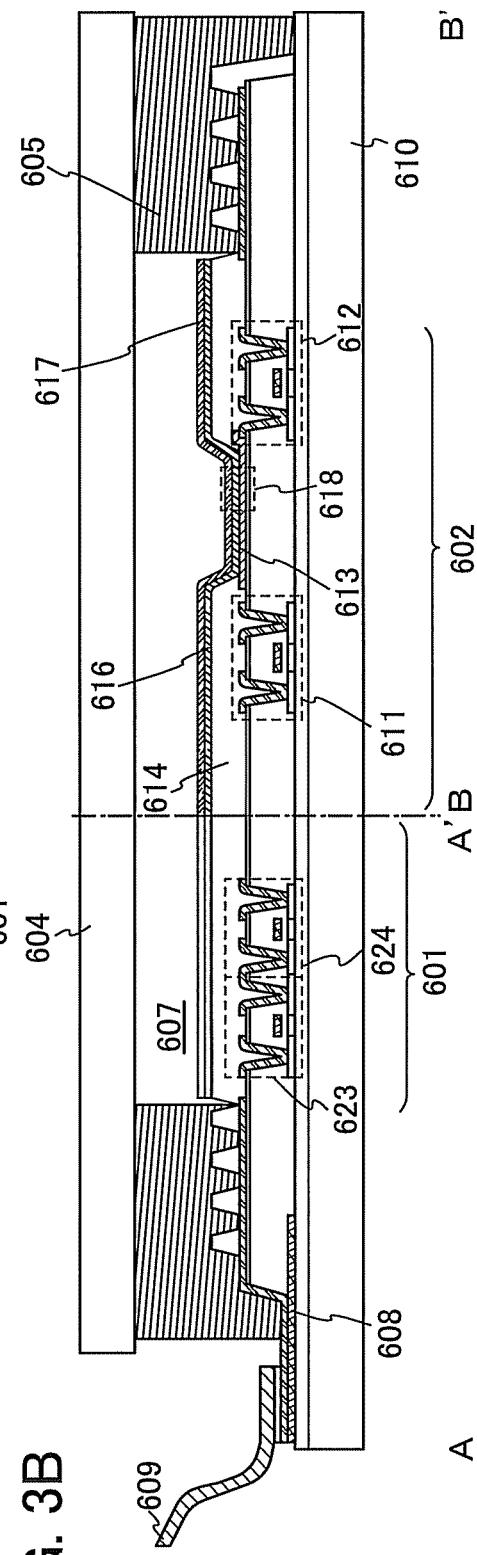

In this embodiment, a light-emitting device which is manufactured using the light-emitting element in any of Embodiments 1 to 3 is described with reference to FIGS. 3A and 3B. Note that FIG. 3A is a top view illustrating the light-emitting device and FIG. 3B is a cross-sectional view of FIG. 3A taken along lines A-A' and B-B'. This light-emitting device includes a driver circuit portion (a source side driver circuit) 601, a pixel portion 602, and a driver circuit portion (a gate side driver circuit) 603, which are indicated by dotted lines, in order to control light emission from the light-emitting element. Further, reference numeral 604 indicates a sealing substrate and reference numeral 605 indicates a sealant. Reference numeral 607 denotes a space surrounded by the sealant 605.

Note that a leading wiring 608 is a wiring for transmitting signals input to the source side driver circuit 601 and the gate side driver circuit 603. The leading wiring 608 receives video signals, clock signals, start signals, reset signals, and the like from a flexible printed circuit (FPC) 609 that serves as an external input terminal. Although only a FPC is illustrated here, this FPC may be provided with a printed wiring board (PWB). The light-emitting device in this specification refers to not only a light-emitting device itself but also a light-emitting device with a FPC or a PWB attached thereto.

Then, the cross-sectional structure is described with reference to FIG. 3B. Although the driver circuit portion and the pixel portion are provided over an element substrate 610, FIG. 3B only illustrates the source side driver circuit 601, which is the driver circuit portion, and one pixel of the pixel portion 602.

Note that a CMOS circuit which is a combination of an n-channel TFT 623 and a p-channel TFT 624 is provided in the source side driver circuit 601. The driver circuit may be formed with any of a variety of circuits such as CMOS circuits, PMOS circuits, and NMOS circuits. In this embodiment, a driver-integrated type in which a driver circuit is formed over a substrate is described; however, the driver circuit is not necessarily formed over the substrate but can be formed outside the substrate.

The pixel portion 602 includes a plurality of pixels each having a switching TFT 611, a current controlling TFT 612, a first electrode 613 electrically connected to a drain of the current controlling TFT 612, and a light-emitting element including the first electrode 613, a layer 616 including an organic compound, and a second electrode 617. Note that an insulator 614 is formed to cover the edge of the first electrode 613. Here, a positive photosensitive acrylic resin film is used to form the insulator 614.

Further, in order to improve the coverage, the insulator 614 is formed to have a curved surface with curvature at an upper end portion or a lower end portion. For example, when positive photosensitive acrylic is used as a material for the insulator 614, it is preferable that only an upper end portion of the insulator 614 have a curved surface with a radius of curvature (0.2 μm to 3 μm). The insulator 614 can be formed using either a negative type that becomes insoluble in an etchant by light irradiation or a positive type that becomes dissoluble in an etchant by light irradiation.

The layer 616 including an organic compound and the second electrode 617 are formed over the first electrode 613, and thus a light-emitting element is formed. As a material used for the first electrode 613 which serves as an anode, a metal, alloy, conductive compound, or mixture thereof which has a high work function (specifically, 4.0 eV or higher) is preferably used. Specifically, a single layer of indium tin oxide (hereinafter, referred to as ITO), indium tin oxide containing silicon or silicon oxide, indium oxide containing zinc oxide (ZnO), indium oxide containing tungsten oxide and zinc oxide (IWZO), gold (Au), platinum (Pt), nickel (Ni), tungsten (W), chromium (Cr), molybdenum (Mo), iron (Fe), cobalt (Co), copper (Cu), palladium (Pd), or a nitride of a metal material (e.g., titanium nitride), can be used. Moreover, a stacked-layer structure of a titanium nitride film and a film containing aluminum as its main component; a three-layer structure of a titanium nitride film, a film containing aluminum as its main component, and a titanium nitride film; or the like can be used. When the stacked-layer structure is applied to a wiring, resistance of the wiring can be low and good ohmic contact can be obtained.

The layer 616 including an organic compound has a similar structure to the layer 107 including an organic compound which is described in Embodiments 1 to 3. Either a low molecular compound or a high molecular compound (such as an oligomer, a dendrimer, or a polymer) may be employed as the material used for the layer 616 including an organic compound. Moreover, not only an organic compound but also an inorganic compound can be used as the material for forming the layer 616 including an organic compound. In addition, the layer 616 including an organic compound is formed by any of a variety of methods such as an evaporation method using an evaporation mask, an ink-jet method, and a spin coating method.

As a material used for the second electrode 617, which is formed over the layer 616 including an organic compound and serves as a cathode, a material having a low work function (such as Al, Mg, Li, Ca, or an alloy or compound thereof, such as MgAg, MgIn, ALi, LiF, or $CaF_2$) is preferably used. Note that in the case where light generated in the layer 616 including an organic compound passes through the second electrode 617, the second electrode 617 is preferably formed by using a stacked layer of a thin metal film with a reduced film thickness and a transparent conductive film (ITO, indium oxide containing zinc oxide at 2 wt % to 20 wt %, indium tin oxide containing silicon or silicon oxide, zinc oxide (ZnO), or the like).

Here, the light-emitting element includes the first electrode 613, the layer 616 including an organic compound, and the second electrode 617. The specific structures and materials of the light-emitting element have been described in Embodiments 1 to 3, and the description is not repeated here. The description in Embodiment 1 to 3 is to be referred to. Note that the first electrode 613, the layer 616 including an organic compound, and the second electrode 617 in this embodiment correspond to the anode 100, the layer 107 including an organic compound, and the cathode 101 in Embodiment 1, respectively.

The element substrate 610 provided with TFTs for the driver circuit and the pixel portion and the light-emitting element and the sealing substrate 604 are attached with the sealant 605 to form a light-emitting device. In the light-emitting device, the light-emitting element 618 having a structure described in any of Embodiments 1 to 3 is provided in the space 607 surrounded by the element substrate 610, the sealing substrate 604, and the sealant 605. Note that the space 607 is filled with a filler, and may be filled with an inert gas (such as nitrogen and argon), the sealant 605, or the like.

Note that an epoxy-based resin is preferably used as the sealant 605. In addition, it is preferable that the material allow as little oxygen as possible to pass therethrough. As the sealing substrate 604, a plastic substrate formed of fiberglass-reinforced plastics (FRP), polyvinyl fluoride (PVF), polyester, acrylic, or the like can be used as well as a glass substrate or a quartz substrate.

As described above, a light-emitting device of this embodiment formed using the light-emitting element described in any of Embodiments 1 to 3 can be obtained.

The light-emitting device of this embodiment includes the light-emitting element described in any of Embodiments 1 to 3 whose degree of deterioration with accumulation of a driving time is low, and therefore is highly reliable. Moreover, the light-emitting element easily realizes an emission color which is intended by a designer, and therefore can have an excellent display quality.

Moreover, the light-emitting element described in any of Embodiments 1 to 3 has a structure which is suitable for a white light-emitting element; thus, the light-emitting element can be suitably used for lighting.

Figure 4A:
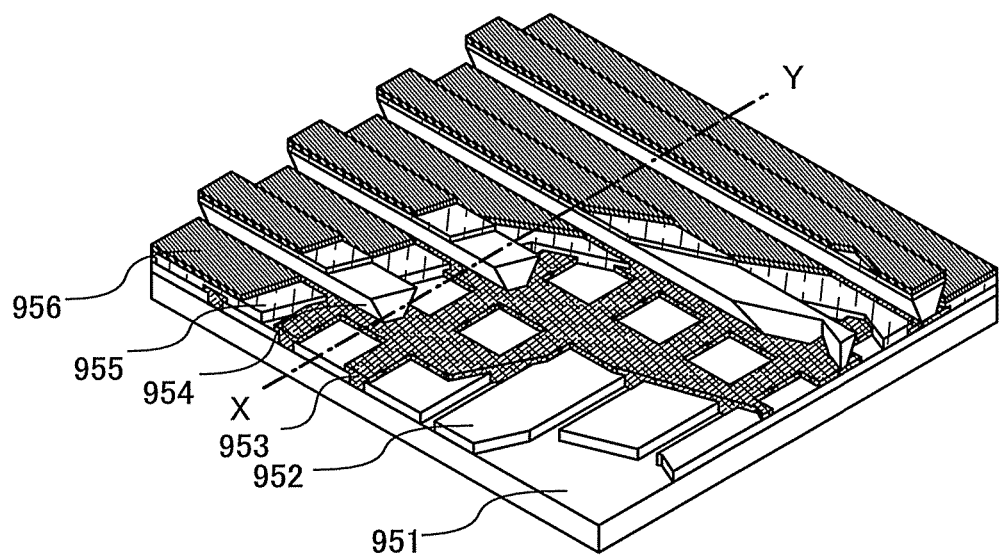
FIG. 4A is a perspective view and FIG. 4B is a cross-sectional view of a light-emitting device according to one embodiment of the present invention.
Figure 4B:
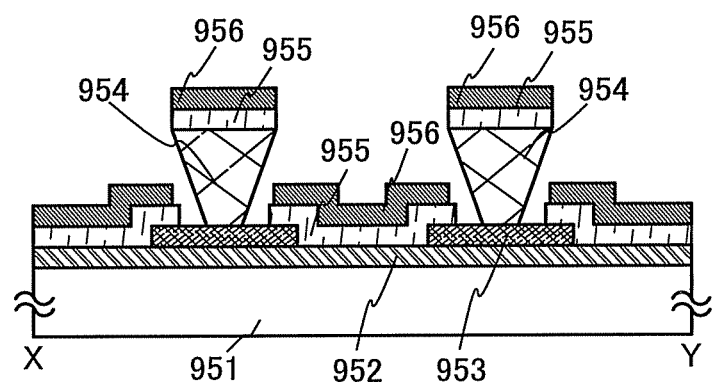

In this embodiment, the active matrix light-emitting device in which the driving of the light-emitting element is controlled by a transistor has been described. However, a passive matrix light-emitting device may be employed. FIGS. 4A and 4B illustrate a passive matrix light-emitting device which is formed using the light-emitting element described in any of Embodiments 1 to 3. FIG. 4A is a perspective view of the light-emitting device, and FIG. 4B is a cross-sectional view taken along line X-Y in FIG. 4A. In FIGS. 4A and 4B, a plurality of stripe-shaped electrodes 952 are formed over a substrate 951, and a layer 955 including an organic compound is provided between the electrode 952 and an electrode 956. An end portion of the electrode 952 is covered with an insulating layer 953. The insulating layer 953 is provided with an opening which corresponds to each pixel portion. A partition layer 954 is provided over the insulating layer 953. Sidewalls of the partition layer 954 are slanted so that the distance between the sidewalls becomes smaller toward a substrate surface. In other words, a cross section of the partition layer 954 in the short side direction is a trapezoidal shape in which a lower side (a side in a similar direction as a plane direction of the insulating layer 953 and in contact with the insulating layer 953) is shorter than an upper side (a side in a similar direction as a plane direction of the insulating layer 953 and not in contact with the insulating layer 953). The partition layer 954 provided in this manner can prevent a defect of the light-emitting element due to static electricity or the like. Also as for a passive matrix light-emitting device, a light-emission device can be manufactured by using the light-emitting element described in Embodiment 1 or 2. In addition, the light-emitting device which is manufactured using the light-emitting element with improved light-emission efficiency can consume less electric power. In addition, since deterioration in luminance with a driving time is reduced in the light-emitting element described in Embodiment 1 or 2, the light-emitting device manufactured using the light-emitting element can be improved in reliability. In addition, since the color balance of the light-emitting element described in Embodiment 1 or 2 is easily adjusted, the light-emitting device manufactured using the light-emitting element can have a high display quality.

Embodiment 5

Figure 5:
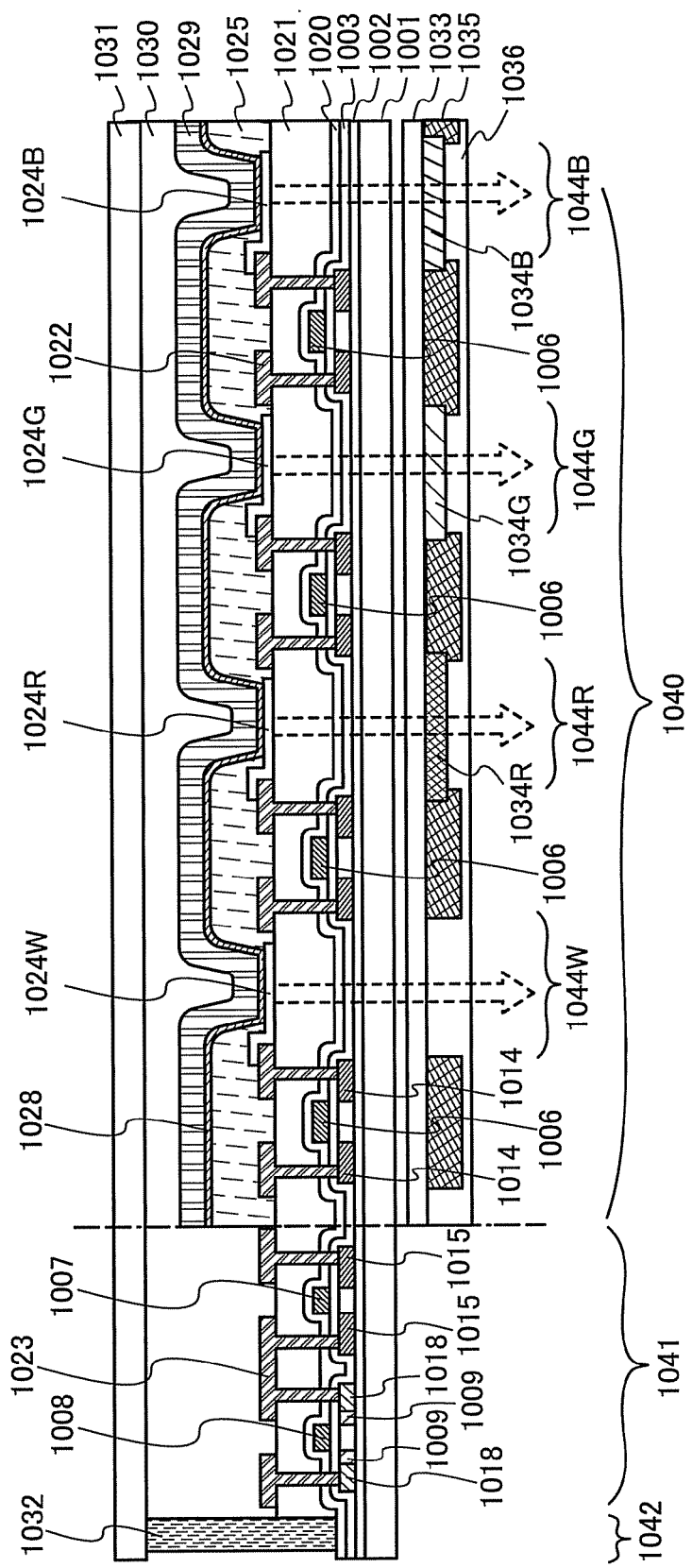
FIG. 5 is a cross-sectional view of a light-emitting device according to one embodiment of the present invention.

Here, an example of a manufacturing process of an active matrix display device is described with reference to FIG. 5.

First, a base insulating film 1002 is formed over a substrate 1001. In this example, light is extracted from a rear of a surface where a light-emitting element is formed over the substrate 1001 and the rear surface is used as a display surface. Therefore, a glass substrate or a quartz substrate which has a light-transmitting property may be used as the substrate 1001. Moreover, a plastic substrate which has a light-transmitting property and which can withstand a process temperature may be used.

As the base insulating film 1002, a base film made of an insulating film such as a silicon oxide film, a silicon nitride film, or a silicon oxynitride film is formed. Although an example of employing the base film having a two-layer structure is described here, the base film may have a single-layer structure or a multilayer structure in which two or more of those layers are stacked. Note that the base insulating film is not always necessarily.

Then, a semiconductor layer is formed over the base insulating film. The semiconductor layer is formed in such a way that after forming a semiconductor film having an amorphous structure by a known means (a sputtering method, an LPCVD method, a plasma CVD method, or the like), the semiconductor film is crystallized so as to be a crystalline semiconductor film by a known crystallization process (a laser crystallization method, a thermal crystallization method, a thermal crystallization method using a catalyst such as nickel, or the like), and then the crystalline semiconductor film is patterned into a desired shape using a first photomask. The thickness of the semiconductor layer is 25 nm to 80 nm (preferably 30 nm to 70 nm). Although the material of the crystalline semiconductor film is not particularly limited, the crystalline semiconductor film is preferably formed by using silicon, a silicon-germanium (SiGe) alloy, or the like.

In the crystallization process of the semiconductor film having an amorphous structure, a continuous wave laser can be used. In order to obtain a crystalline semiconductor film having a large grain size by crystallizing the amorphous semiconductor film, it is preferable to use any one of second to fourth harmonics of a fundamental wave emitted from a continuous wave solid-state laser. Typically, the second harmonics (532 nm) or the third harmonics (355 nm) of a Nd:YVO$_4$ laser (fundamental wave: 1064 nm) is preferably employed. When a continuous wave laser is used, laser light emitted from a continuous wave YVO$_4$ laser of output power of 10 W is converted into a harmonic by a nonlinear optical element. The harmonic can also be obtained by putting a YVO$_4$ crystal and a non-linear optical element in a resonator. Then, the laser light having a rectangular shape or an elliptical shape on an irradiated surface is preferably formed by an optical system, and an object is irradiated with this laser light. The energy density here should be in the range of approximately 0.01 MW/cm$^2$ to 100 MW/cm$^2$ (preferably 0.1 MW/cm$^2$ to 10 MW/cm$^2$). The semiconductor film may be irradiated with the laser light while being moved at a rate of approximately 10 cm/s to 2000 cm/s with respect to the laser light.

In addition, laser crystallization can be performed using a pulsed laser light with a repetition rate of 0.5 MHz or greater, which is much higher than a generally used repetition rate band, several tens to several hundreds of Hz. It takes several tens to several hundreds of nanoseconds to solidify a semiconductor film completely after the semiconductor film is melted by being irradiated with pulsed laser light. Therefore, by using the aforementioned repetition rate band, a semiconductor film can be irradiated with the next pulsed laser light before the semiconductor film dissolved by the previous laser light is solidified. Since a solid-liquid interface can be continuously moved in the semiconductor film, a semiconductor film having crystal grains which grow continuously in the scanning direction of the laser beam is formed. Specifically, an aggregation of crystal grains having a width of 10 µm to 30 µm in the scanning direction and a width of 1 µm to 5 µm in the direction perpendicular to the scanning direction can be formed. By forming crystal grains of single crystal extended along the scanning direction, a semiconductor film which has almost no crystal boundary at least in a channel direction of a thin film transistor can be formed.

The amorphous semiconductor film may be crystallized by a combination of thermal treatment and laser light irradiation, or by plural times of either thermal treatment or laser light irradiation.

Then, after a resist mask is removed, a gate insulating film 1003 for covering the semiconductor layer is formed. The gate insulating film 1003 is formed with a thickness of 1 nm to 200 nm by a plasma CVD method or a sputtering method.

Then, a conductive film with a thickness of 100 nm to 600 nm is formed over the gate insulating film 1003. Here, a laminate including a titanium nitride film and a tungsten film is formed as the conductive film. Note that although an example in which the conductive film is formed with a laminate including a titanium nitride film and a tungsten film is described, the structure is not particularly limited. A single layer or laminate of a film of an element selected from Ta, W, Ti, Mo, Al, and Cu or an alloy material or compound material which contains any of those elements as its main component may be formed as the conductive film. Alternatively, a semiconductor film typified by a polycrystalline silicon film doped with an impurity element such as phosphorus may be used.

Next, a resist mask is formed using a second photomask and etching is conducted by a dry etching method or a wet etching method. The conductive film is etched by this etching step to obtain conductive layers 1006 to 1008. Note that those conductive layers serve as gate electrodes of TFTs.

Then, the resist mask is removed. Then, a resist mask is newly formed using a third photomask, and in order to form an n-channel TFT in a driver circuit, a first doping step is conducted for doping the semiconductor with an impurity element imparting n-type conductivity (typically, phosphorus or As) at low concentration. The resist mask covers a region in which a p-channel TFT is formed and a vicinity of the conductive layer. Doping is performed through the gate insulating film 1003 in this first doping step to form low concentration-impurity regions 1009. One light-emitting element is driven with a plurality of TFTs. However, in a case where the light-emitting element is driven by only p-channel TFTs or in a case where a pixel and a driver circuit are not formed over the same substrate, the above doping step is not particularly needed.

Then, after removing the resist mask, a resist mask is newly formed using a fourth photomask. A second doping step is conducted for doping the semiconductor with an impurity element imparting p-type conductivity (typically boron) at high concentration. Doping is performed through the gate insulating film 1003 in this second doping step to form p-type high concentration-impurity regions 1014 and 1015.

Then, a resist mask is newly formed using a fifth photomask, and in order to form an n-channel TFT in the driver circuit, a third doping step is conducted for doping the semiconductor layer with an impurity element imparting n-type conductivity (typically, phosphorus or As) at high concentration. The third doping step is conducted by an ion doping method under a condition where the dose is $1\times10^{13}/cm^2$ to $5\times10^{15}/cm^2$ and the accelerating voltage is 60 keV to 100 keV. The resist mask covers a region in which a p-channel TFT is formed and a vicinity of the conductive layer. Doping is performed through the gate insulating film 1003 in this third doping step to form an n-type high concentration-impurity region 1018.

Then, the resist mask is removed. After that, a first interlayer insulating film 1020 including hydrogen is formed. Then, the impurity element added to the semiconductor layer is activated and the semiconductor layer is hydrogenated. As for the first interlayer insulating film 1020 including hydrogen, a silicon nitride oxide film (a SINO film) which is obtained by a PCVD method is used. In the above crystallization, the semiconductor film can be crystallized using a metal element which promotes crystallization as typified by nickel. In the case of using a metal element which promotes crystallization as typified by nickel, gettering can also be carried out for reduction of nickel in a channel formation region at the same time as the activation.

Then, a second interlayer insulating film 1021 for planarization is formed. As the second interlayer insulating film 1021, an insulating film in which a skeleton structure is formed by a bond of silicon (Si) and oxygen (O) obtained by a coating method is used. Alternatively, as the second interlayer insulating film 1021, an organic resin film having a light-transmitting property can be used. An insulating fim which is formed using another organic material, an inorganic material, and/or the like may be used as the second interlayer insulating film 1021.

Then, etching is performed using a sixth mask to form a contact hole in the second interlayer insulating film 1021 and to remove the second interlayer insulating film 1021 in a peripheral portion 1042 at the same time.

Then, etching is performed using the sixth mask to selectively remove the gate insulating film 1003 and the first interlayer insulating film 1020 which are exposed.

After removing the sixth mask, a conductive film having a three-layer structure which is in contact with the semiconductor layer in the contact hole, is formed. Note that those three layers are preferably formed successively with one sputtering apparatus so as not to oxidize a surface of each layer. However, the conductive film is not limited to the three-layer structure. The conductive film may have two layers or a single layer, and as a material thereof, an element selected from Ta, W, Ti, Mo, Al, or Cu, or an alloy material or compound material which contains any of those elements as its main component may be used.

Then, etching of the conductive film is performed using a seventh mask to form a wiring or an electrode. Among the wiring or electrode, a connection electrode 1022 which connects an anode of the light-emitting element and the TFT is shown in a pixel portion 1040, and a connection electrode 1023 which electrically connects an n-channel TFT and a p-channel TFT is shown in a driver circuit portion 1041.

Then, a transparent conductive film is formed to be in contact with the wiring or electrode having the three-layer structure. Then, the transparent conductive film is etched using an eighth mask to form first electrodes 1024W, 1024R, 1024G, and 1024B of light-emitting elements, that is, an anode of a light-emitting element.

As a material for the anode of the light-emitting element, as described in detail in Embodiment 3, indium tin oxide (ITO)

or ITSO (indium tin oxide containing silicon oxide obtained by a sputtering method using a target of ITO which contains silicon oxide at 2 wt % to 10 wt %) can be used. In addition to ITSO, a transparent conductive film such as a light-transmitting conductive oxide (IZO) film, which is a film of indium oxide containing silicon oxide in which zinc oxide (ZnO) is mixed at 2% to 20% may be used. Further, a transparent conductive film of antimony tin oxide (ATO) may be used.

Note that in the case where ITO is used for the first electrodes 1024W, 1024R, 1024G, and 1024B, baking for crystallization of the first electrodes is performed to lower electric resistivity. On the other hand, unlike ITO, ITSO and IZO are not crystallized when baking is performed thereon, and they keep an amorphous structure.

Next, an insulator 1025 (referred to as a bank, a partition, a barrier, an embankment, or the like) for covering an edge of the first electrodes 1024W, 1024R, 1024G, and 1024B is selectively formed using the eighth mask. As the insulator 1025, a tantalum oxide film or a titanium oxide ($TiO_2$) film which is obtained by a sputtering method, or an organic resin film obtained by a coating method, with a thickness in the range of 0.8 μm to 1 μm, is used.

Then, a layer 1028 including an organic compound is formed over the first electrodes 1024W, 1024R, 1024G, and 1024B and the insulator 1025. The layer 1028 including an organic compound can be formed by the manufacturing method described in any of Embodiments 1 to 3 to have the structure described in any of Embodiments 1 to 3. Note that in order to improve the reliability of the organic light-emitting element, it is preferable to perform deaeration by vacuum heating before forming the layer 1028 including an organic compound. For example, it is preferable to perform thermal treatment at a temperature of 200° C. to 300° C. under a reduced pressure atmosphere or an inert atmosphere in order to remove a gas included in the substrate, before evaporating an organic compound material. In this embodiment, light-emitting substances which emit red, green, and blue light are included in layers serving as light-emitting layers (a first layer to a fourth layer) in the layer 1028 including an organic compound so that the layer 1028 including an organic compound can emit white light.

Then, a second electrode 1029 of the light-emitting element is formed over an entire surface of the pixel portion. The second electrode 1029 serves as a cathode. Substances which can be used for the cathode of the light-emitting element are described in detail in Embodiment 3. Here, a film of aluminium is formed by a vacuum evaporation method with a thickness of 200 nm as the second electrode 1029. In this embodiment, light is extracted from a rear of a surface where a light-emitting element is formed over the substrate 1001; therefore, the second electrode 1029, which is the cathode of the light-emitting element, is a reflective electrode. Accordingly, as the structures of the first layer to the fourth layer in the layer 1028 including an organic compound, the structures described in Embodiment 1 are preferably employed. Note that although one electrode of a pair of electrodes which is near the thin film transistor side is used as the anode in this embodiment, the electrode which is near the thin film transistor side may be used as the cathode. In that case, the anode serves as the reflective electrode in general; therefore, the structures described in Embodiment 2 are preferably employed as the structures of the first layer to the fourth layer in the layer 1028 including an organic compound. When the electrode of the pair of electrodes which is near the TFT side is used as the cathode, a TFT which is directly connected to the light-emitting element is formed as an n-channel TFT.

Then, a sealing substrate 1031 is used for sealing. As a material of the sealing substrate 1031, a metal material, a ceramic material, a glass substrate, or the like can be used. The sealing substrate 1031 is attached with a sealant 1032 by the peripheral portion 1042 of the substrate 1001. Note that a spacer or filler may be used for keeping a uniform interval between the substrates. In addition, a gap 1030 between the pair of substrates is preferably filled with an inert gas.

In order to achieve full-color display, a transparent member 1033 provided with coloring layers (a red coloring layer 1034R, a green coloring layer 1034G, and a blue coloring layer 1034B) is provided in a light path which leads to the outside of the light-emitting device. Further, a black layer (a black matrix) 1035 may be additionally provided. The transparent member 1033 provided with the coloring layers and the black layer is positioned and fixed to the substrate 1001. Note that the coloring layers and the black layer are covered with an overcoat layer 1036. In this embodiment, light emitted from some of the light-emitting layers is emitted outside without passing through the coloring layer, while light emitted from the other of the light-emitting layers is emitted outside after passing through the coloring layer. Since light which does not pass through the coloring layer is white and light which passes through any one of the coloring layers is red, blue, or green; images can be displayed with pixels of the four colors.

Figure 6:
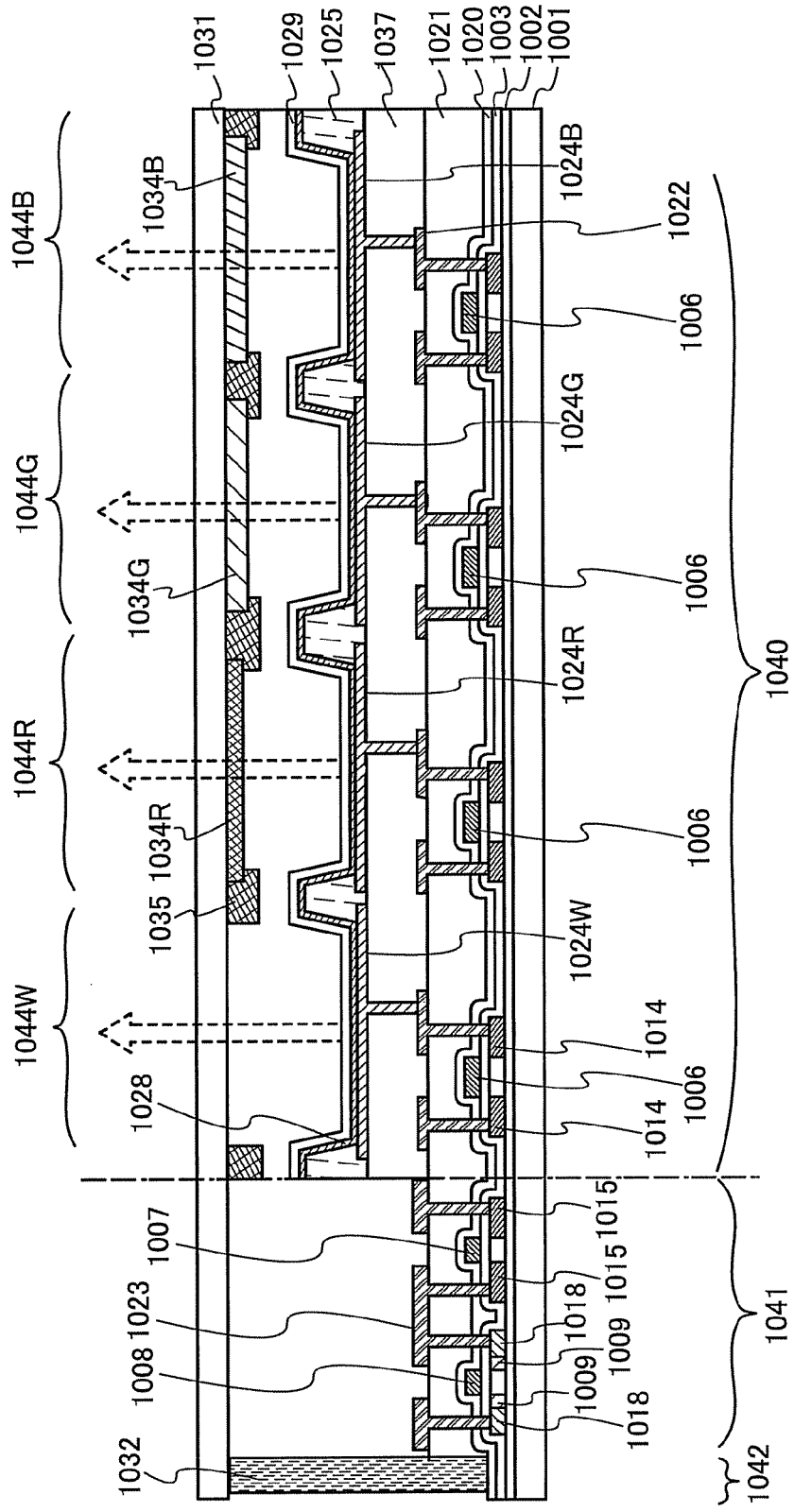
FIG. 6 is a cross-sectional view of a light-emitting device according to one embodiment of the present invention.

Although the light-emitting device has a structure (a bottom emission structure), in which light is extracted from a rear of a surface of the substrate 1001 over which TFTs are provided in the above description, the light-emitting device may have a structure (a top emission structure), in which light is extracted through the sealing substrate 1031. FIG. 6 is a cross-sectional view of a light-emitting device having a top emission structure. In this case, a substrate which does not transmit light can be used as the substrate 1001. The light-emitting device having a top emission structure is formed similarly to the light-emitting device having a bottom emission structure up to the formation of the connection electrode 1022 which connects the TFT and the anode of the light-emitting element. After that, a third interlayer insulating film 1037 is formed to cover the connection electrode 1022. The third interlayer insulating film may have a planarization function. The third interlayer insulating film can be formed of a material which is similar to a material for the second interlayer insulating film 1021 or another known material.

Then, the first electrodes 1024W, 1024R, 1024G, and 1024B of the light-emitting elements are formed. Although the first electrodes 1024W, 1024R, 1024G, and 1024B serve as anodes here, they may serve as cathodes. Further, in the case of the light-emitting device having a top emission structure, the first electrode is preferably a reflective electrode. Accordingly, when the first electrode is a reflective electrode and also an anode, the layer 1028 including an organic compound preferably has the structure described in Embodiment 2. On the other hand, when the first electrode is a reflective electrode and also a cathode, the layer 1028 including an organic compound preferably has the structure described in Embodiment 1.

Then, the layer 1028 including an organic compound is formed to cover the first electrodes 1024W, 1024R, 1024G, and 1024B, and an exposed portion of the third interlayer insulating film 1037. The layer 1028 including an organic compound is formed to have a structure similar to the structure described in Embodiment 2. Next, the second electrode 1029 of the light-emitting element is formed to transmit light from the light-emitting element.

Then, sealing is performed with the sealing substrate 1031 provided with the coloring layers (the red coloring layer 1034R, the green coloring layer 1034G, and the blue coloring layer 1034B) in a light path which leads to the outside, thus, the light-emitting device having a top emission structure can be formed. The sealing substrate 1031 may be provided with the black layer (the black matrix) 1035 which is positioned between pixels. The coloring layers (the red coloring layer 1034R, the green coloring layer 1034G, and the blue coloring layer 1034B) and the black layer (the black matrix) 1035 may be covered with an overcoat layer (not shown). Note that a light-transmitting substrate is used as the sealing substrate 1031.

When voltage is applied between the pair of electrodes of the thus obtained organic light-emitting element, a white-light-emitting region 1044W can be obtained. In addition, by using the coloring layers, a red-light-emitting region 1044R, a blue-light-emitting region 1044B, and a green-light-emitting region 1044G are obtained. In this embodiment, since the light-emitting element described in Embodiment 1 or 2 is used, the light emitting layers are not necessarily formed separately depending on the light-emission color of the pixels. Therefore, a full-color light-emitting device can be obtained at low cost and in a simple manner. Further, since the coloring layers have different light transmittances depending on the colors or the materials of the coloring layers and the luminosity factor differs depending on the colors, the light-emitting element desirably emits light with desired luminance in each wavelength region. In this regard, the color balance of the light-emitting element described in any of Embodiments 1 to 3 is easily adjusted, and thus the light-emitting device described in this embodiment can display images with high quality and with high color reproducibility.

Here, a top gate TFT having polysilicon in an active layer is used. However, the TFT is not particularly limited as long as it can serve as a switching element, and a bottom gate (an inverted staggered) TFT or a staggered TFT can be used. Further, a TFT having an amorphous silicon film or a ZnO film as an active layer may be used. Further, the TFT is not limited to a TFT having a single gate structure or a double gate structure, and a multi-gate TFT having three or more channel formation regions may be employed.

Further, although an example in which full-color display is performed by four-color driving of red, green, blue, and white is shown here, there is no particular limitation and full-color display by three-color driving of red, green, and blue may be performed.

This embodiment can be optionally combined with any one of the light-emitting element described in any one of Embodiments 1 to 3 and the light-emitting device in Embodiment 4.

Embodiment 6

In this embodiment, an electronic appliance which includes the light emitting device described in Embodiment 4 is described. These electronic appliances have a display portion including the light-emitting element described in any of Embodiments 1 to 3.

As an electronic appliance including a light-emitting element described in any of Embodiments 1 to 3, cameras such as a video camera and a digital camera, a goggle type display, a navigation system, an audio playback device (a car audio set, an audio component set, or the like), a computer, a game machine, a portable information terminal (a mobile computer, a cellular phone, a portable game machine, an electronic book reader, or the like), an image reproducing device provided with a recording medium (specifically, a digital versatile disc (DVD)), and the like are given. Specific examples of those electronic appliances are shown in FIGS. 7A to 7D.

Figure 7A:
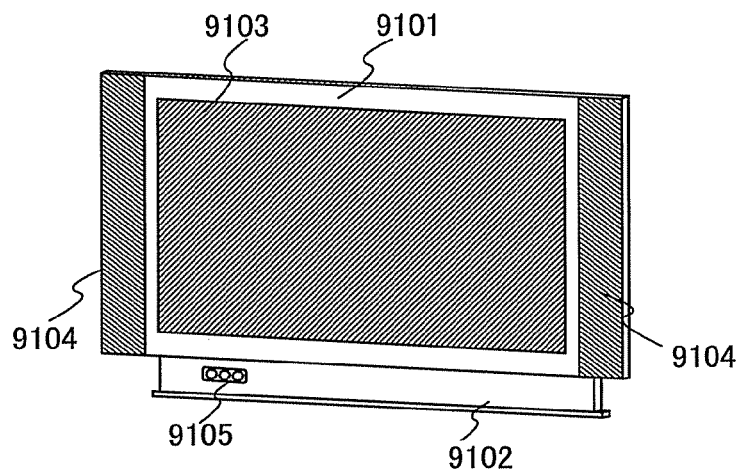
FIGS. 7A to 7D each illustrate an electronic appliance according to one embodiment of the present invention.

FIG. 7A illustrates a television device according to this embodiment which includes a housing 9101, a support base 9102, a display portion 9103, a speaker portion 9104, a video input terminal 9105, and the like. In this television device, the display portion 9103 is manufactured using the light-emitting element described in any of Embodiments 1 to 3 as a display element. This television device manufactured using the light-emitting element whose degree of deterioration with accumulation of a driving time is reduced has the highly reliable display portion 9103, and the television device provided with the display portion 9103 has high reliability. Since the degree of deterioration of the light-emitting element is reduced, deterioration compensation function circuits incorporated in the television device can be greatly reduced in size or in number. In addition, the television device manufactured using the light-emitting element with improved light-emission efficiency consumes less power. Further in addition, the television device manufactured using the light-emitting element the color balance of which is easily adjusted can have a high display quality.

Figure 7B:
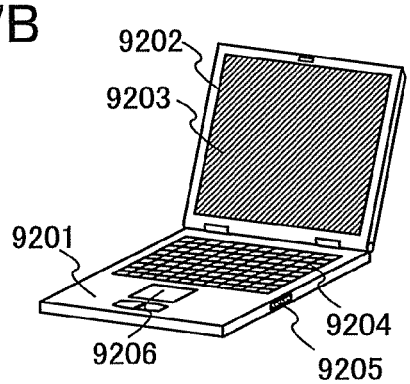

FIG. 7B illustrates a computer according to this embodiment which includes a main body 9201, a housing 9202, a display portion 9203, a keyboard 9204, an external connection port 9205, a pointing device 9206, and the like. In this computer, the display portion 9203 is manufactured using the light-emitting element described in any of Embodiments 1 to 3 as a display element. This computer manufactured using the light-emitting element whose degree of deterioration with accumulation of a driving time is reduced has the highly reliable display portion 9203, and the computer provided with the display portion 9203 has high reliability. Since the degree of deterioration of the light-emitting element is reduced, deterioration compensation function circuits incorporated in the computer can be greatly reduced in size or in number; thus, reduction in size and weight of the computer can be achieved. In addition, the computer manufactured using the light-emitting element with improved light-emission efficiency consumes less power. Further in addition, the computer manufactured using the light-emitting element the color balance of which is easily adjusted can have a high display quality.

Figure 7C:
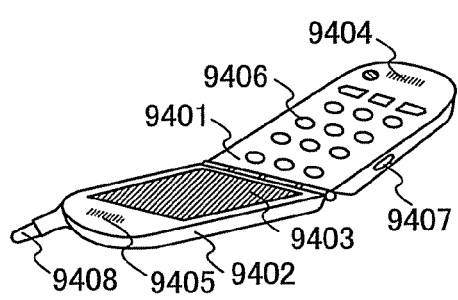

FIG. 7C illustrates a cellular phone according to this embodiment which includes a main body 9401, a housing 9402, a display portion 9403, an audio input portion 9404, an audio output portion 9405, operation keys 9406, an external connection port 9407, an antenna 9408, and the like. In this cellular phone, the display portion 9403 is manufactured using the light-emitting element described in any of Embodiments 1 to 3 as a display element. This cellular phone manufactured using the light-emitting element whose degree of deterioration with accumulation of a driving time is reduced has the highly reliable display portion 9403, and the cellular phone provided with the display portion 9403 has high reliability. Since the degree of deterioration of the light-emitting element is reduced, deterioration compensation function circuits incorporated in the cellular phone can be greatly reduced in size or in number; thus, further reduction in size and weight of the cellular phone can be achieved. The downsized and lightweight cellular phone in this embodiment can have a size and weight suitable for being carried, even when various additional values are added to the cellular phone, and is suitable for a highly functional cellular phone. In addition, the cellular phone manufactured using the light-emitting element with improved light-emission efficiency consumes less power. Further in addition, the cellular phone manufactured using the light-emitting element the color balance of which is easily adjusted can have a high display quality.

Figure 7D:
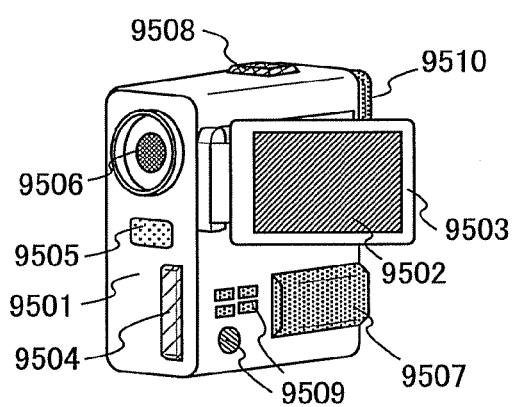

FIG. 7D illustrates a camera according to this embodiment which includes a main body 9501, a display portion 9502, a housing 9503, an external connection port 9504, a remote control receiving portion 9505, an image receiving portion 9506, a battery 9507, an audio input portion 9508, an operation key 9509, an eyepiece portion 9510, and the like. In this camera, the display portion 9502 is manufactured using the light-emitting element described in any of Embodiments 1 to 3 as a display element. This camera manufactured using the light-emitting element whose degree of deterioration with accumulation of a driving time is reduced has the highly reliable display portion 9502, and the camera provided with the display portion 9502 has high reliability. Since the degree of deterioration of the light-emitting element is reduced, deterioration compensation function circuits incorporated in the camera can be greatly reduced in size or in number; thus, reduction in size and weight of the camera can be achieved. In addition, the camera manufactured using the light-emitting element with improved light-emission efficiency consumes less power. Further in addition, the camera manufactured using the light-emitting element the color balance of which is easily adjusted can have a high display quality.

As described above, the application range of the light-emitting device manufactured using the light-emitting element described in any of Embodiments 1 to 3 is so wide that the light-emitting device can be applied to electronic appliances of various fields. This display portion manufactured using the light-emitting element has a low degree of deterioration with accumulation of a driving time, and the electronic appliance provided with the display portion can have high reliability. In addition, the display portion manufactured using the light-emitting element with improved light-emission efficiency can reduce power consumption; therefore, an electronic appliance having the display portion consumes less power. Further in addition, the display portion manufactured using the light-emitting element the color balance of which is easily adjusted can have a high display quality; therefore, an electronic appliance having the display portion can have a high display quality.

In addition, the light-emitting device of this embodiment can also be used for a lighting apparatus. One mode of application of the light-emitting element described in any of Embodiments 1 to 3 to a lighting apparatus will be described with reference to FIG. 8.

Figure 8:
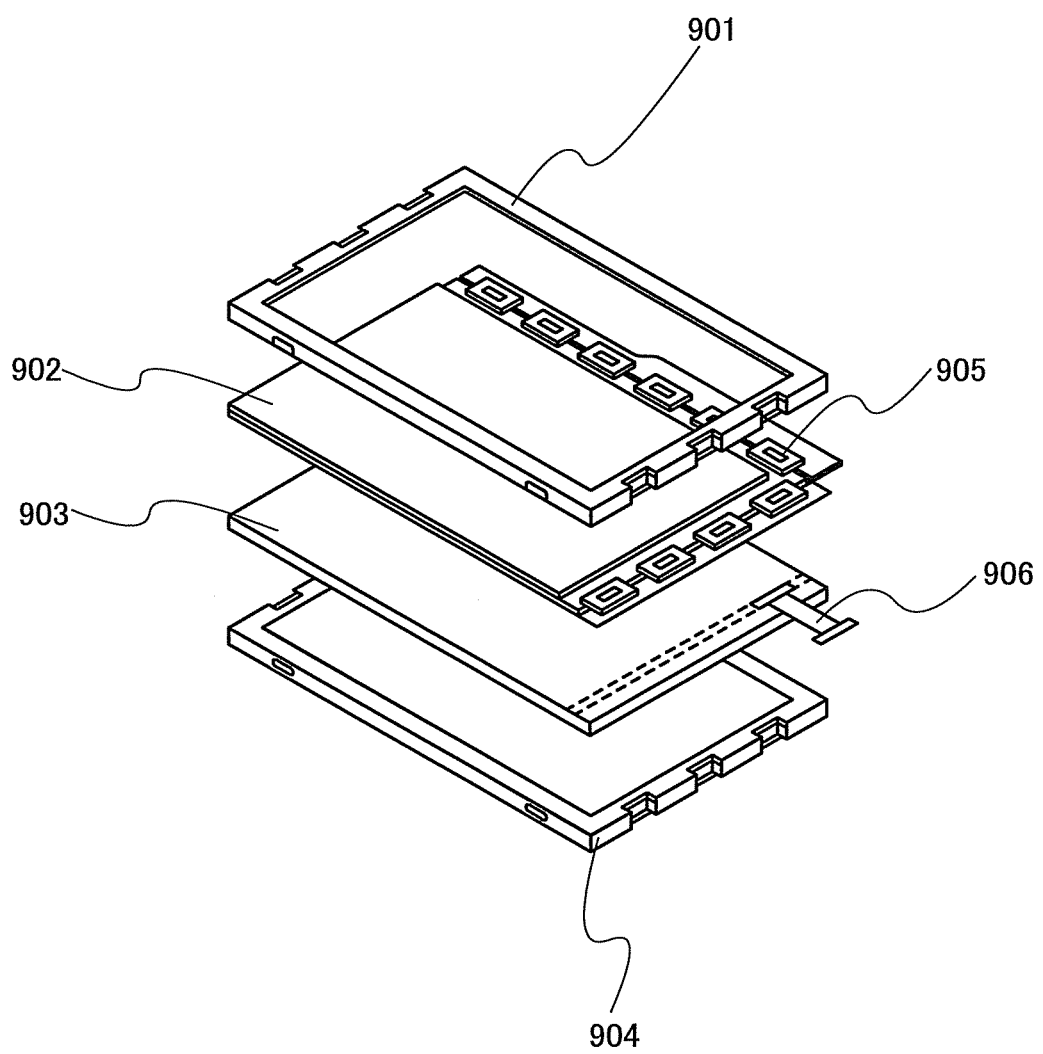
FIG. 8 illustrates an electronic appliance according to one embodiment of the present invention.

FIG. 8 shows an example of a liquid crystal display device in which the light-emitting element described in any of Embodiments 1 to 3 is applied as a backlight. The liquid crystal display device shown in FIG. 8 includes a housing 901, a liquid crystal layer 902, a backlight unit 903, and a housing 904. The liquid crystal layer 902 is connected to a driver IC 905. In addition, the backlight unit 903 is formed using the light-emitting element described in any of Embodiments 1 to 3, and current is supplied through a terminal 906.

It is desirable that the backlight unit 903 of the liquid crystal exhibit an emission color which becomes suitable light when the light is transmitted through a color filter provided for each pixel and seen by eyes of people who actually watch the liquid crystal display device. That is, although a film which transmits light of red, blue, or green is normally provided for each pixel as a color filter, the color filter has a different light transmittance depending on the material of the color filter and the luminosity factor differs depending on the color, and thus the backlight desirably has desired luminance in each of the wavelength regions, red, blue, and green. In this regard, the color balance of the light-emitting element described in any of Embodiments 1 to 3 is easily adjusted, and therefore, can be very suitably used for the backlight unit 903 of the liquid crystal.

Note that only one light-emitting element described in any of Embodiments 1 to 3 or a plurality of light-emitting elements described in any of Embodiments 1 to 3 may be used for the backlight unit 903.

As described above, the light-emitting element described in any of Embodiments 1 to 3 can be applied to the backlight of the liquid crystal display device. The area of the backlight can be enlarged, and thus the liquid crystal display device also can be enlarged. When the backlight is manufactured using the light-emitting element whose degree of deterioration with accumulation of a driving time is low, a highly reliable backlight can be obtained. Furthermore, the backlight is thin and a desired emission color can be easily obtained with this backlight; thus, reduction in thickness of the liquid crystal display device and improvement in quality of images are possible. In addition, since the backlight consumes less power, reduction in power consumption of the liquid crystal display device can be realized.

Figure 9:
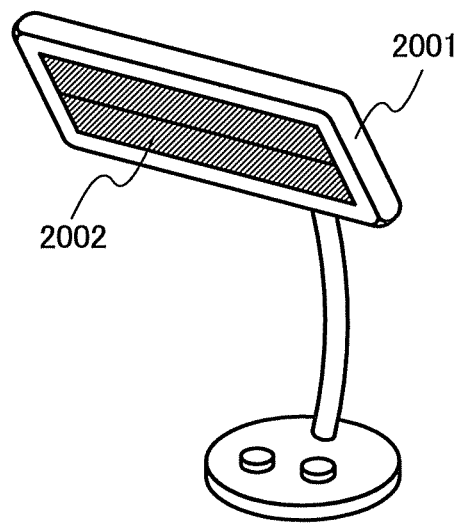
FIG. 9 illustrates a lighting apparatus according to one embodiment of the present invention.

FIG. 9 illustrates an example in which the light-emitting element described in any of Embodiments 1 to 3 is used for a desk lamp, which is a lighting apparatus. The desk lamp in FIG. 9 includes a housing 2001 and a light source 2002, and the light-emitting element described in any of Embodiments 1 to 3 is used for the light source 2002. The light source 2002 may include one or a plurality of light-emitting elements described in any of Embodiments 1 to 3. Further, the light source 2002 may includes plural types of light-emitting elements which emit different colors. As described above, the light source 2002 can be manufactured using the light-emitting element described in any of Embodiments 1 to 3. This light source 2002 manufactured using the light-emitting element whose degree of deterioration with accumulation of a driving time is low has high reliability; accordingly, the desk lamp provided with the light source 2002 can have high reliability. Moreover, since the color balance of the light-emitting element described in any of Embodiments 1 to 3 is easily adjusted, a desk lamp which has emission colors for purposes, for example, eye-friendly emission colors, can be easily provided. In addition, since the light-emission efficiency of the light-emitting element described in any of Embodiments 1 to 3 is improved, a desk lamp with reduced power consumption can be provided.

Figure 10:
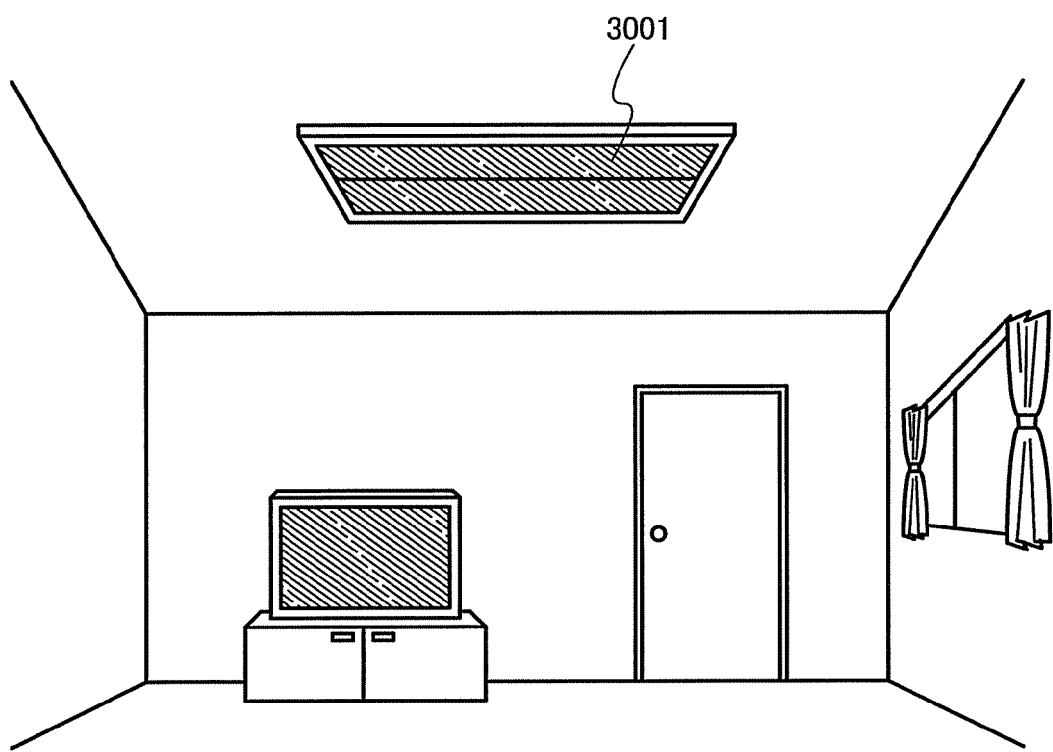
FIG. 10 illustrates a lighting apparatus according to one embodiment of the present invention.

FIG. 10 illustrates an example in which the light-emitting element described in any of Embodiments 1 to 3 is used for an indoor lighting apparatus 3001. The lighting apparatus 3001 may include one or a plurality of light-emitting elements described in any of Embodiments 1 to 3. Further, the lighting apparatus 3001 may includes plural types of light-emitting elements which emit different colors. As described above, the lighting apparatus 3001 can be manufactured using the light-emitting element described in any of Embodiments 1 to 3. The area of the lighting apparatus 3001 formed using the light-emitting element can be enlarged, and thus the lighting apparatus 3001 can be used as a large area illumination apparatus. The lighting apparatus 3001 formed using the light-emitting element having high light-emission efficiency is thin and can consume less power. Further, the lighting apparatus 3001 manufactured using the light-emitting element whose degree of deterioration with accumulation of a driving time is low can have high reliability. Furthermore, since the color balance of the light-emitting element described in any of Embodiments 1 to 3 is easily adjusted, various emission colors from warm colors to cold colors can be easily provided. In addition, since the light-emission efficiency of the light-emitting element described in any of Embodiments 1 to 3 is improved, a lighting apparatus with reduced power consumption can be provided.

Example 1

In this example, the light-emitting element of Embodiment 1 and a comparative light-emitting element were fabricated and element characteristics thereof were measured. The fabrication method and element characteristics are described below. In this example, in order to obtain a light-emitting element which emits white light, substances which emit light of red, blue, and green were used as light-emitting substances in this example. Note that structures of organic compounds which were used in a light-emitting element 1, a light-emitting element 2, and the comparative light-emitting element are shown below.

(i)

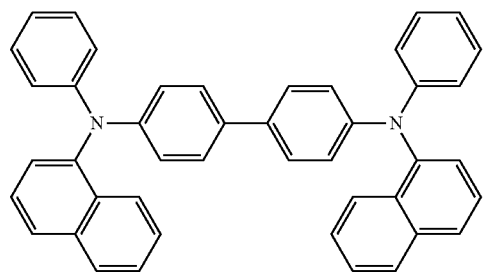

(ii)

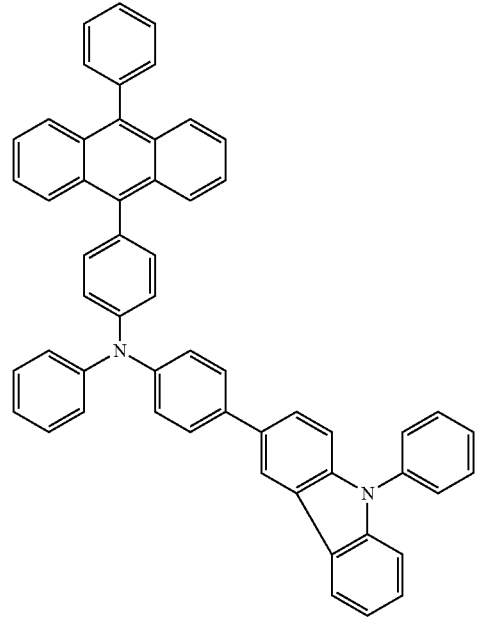

(iii)

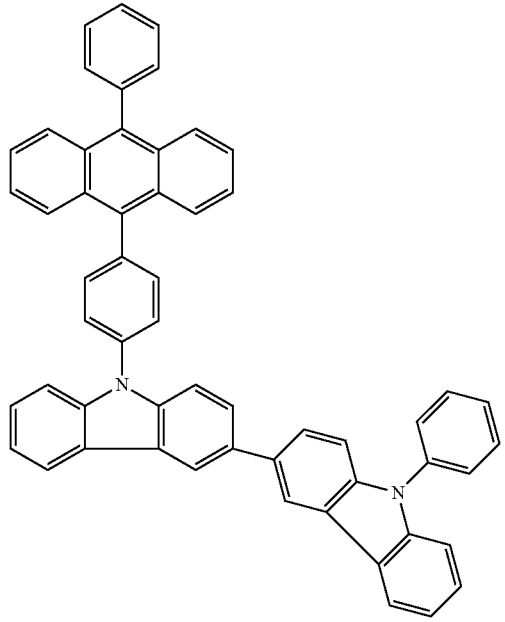

(iv)

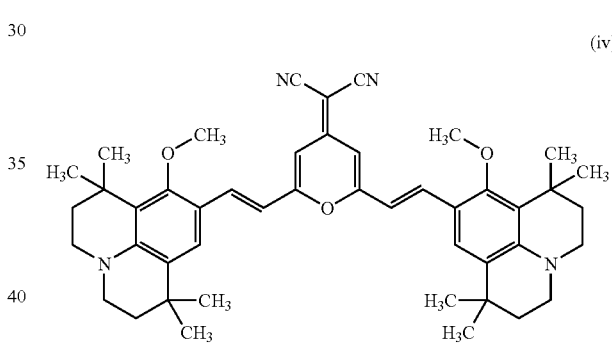

(v)

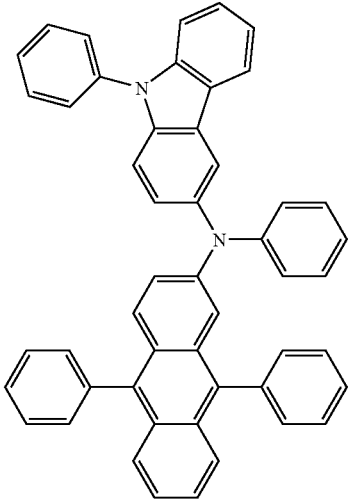

-continued

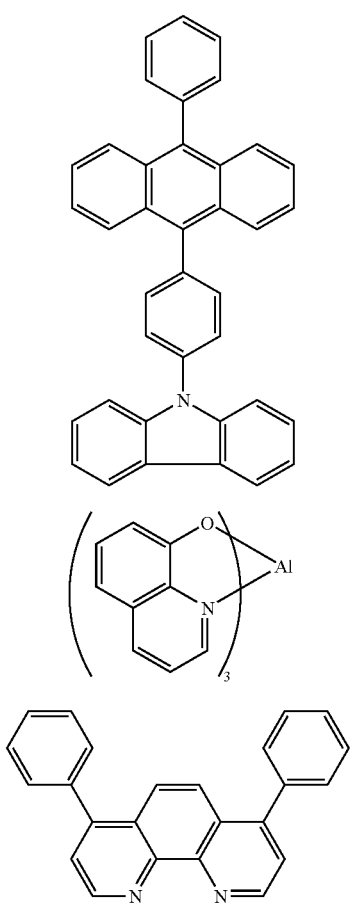

(Fabrication of Light-Emitting Element 1)

First, indium tin oxide containing silicon or silicon oxide was deposited to a thickness of 110 nm on a glass substrate by a sputtering method to form a first electrode (an electrode area: 2 mm×2 mm).

Then, the substrate provided with the first electrode was fixed to a substrate holder in a vacuum evaporation apparatus so that a surface of the substrate which is provided with the first electrode faced downward, and the pressure was reduced to approximately $10^{-4}$ Pa, and then 4,4'-bis[N-(1-naphthyl)-N-phenylamino]biphenyl (abbreviation: NPB) represented in the above structural formula (i) and molybdenum(VI) oxide were co-evaporated, whereby a layer including a composite material of an organic compound and an inorganic compound was formed. The thickness of the layer was 50 nm and the weight ratio between NPB and molybdenum(VI) oxide was adjusted to be 4:1 (=NPB:molybdenum oxide). Note that a co-evaporation method is an evaporation method in which evaporation is carried out from a plurality of evaporation sources at the same time in one treatment chamber.

Then, NPB was deposited to a thickness of 10 nm by an evaporation method using resistance heating to form a hole-transporting layer.

Then, a film of 4-(10-phenyl-9-anthryl)-4'-(9-phenyl-9H-carbazol-3-yl)triphenylamine (abbreviation: PCBAPA) represented in the above structural formula (ii) was formed to a thickness of 10 nm as a first layer. PCBAPA is a substance which has a hole-transporting property and emits blue light.

Then, 9-phenyl-9'-[4-(10-phenyl-9-anthryl)phenyl]-3,3'-bi(9H-carbazole) (abbreviation: PCCPA) represented in the above structural formula (iii) and 2-{2,6-bis[2-(8-methoxy-1,1,7,7-tetramethyl-2,3,6,7-tetrahydro-1H,5H-benzo[ij] quinozin-9-yl)ethenyl]-4H-pyran-4-ylidene}propanedinitrile (abbreviation: BisDCJTM) represented in the above structural formula (iv) were co-evaporated with a ratio of PCCPA to BisDCJTM being 1 to 0.005, whereby a second layer was formed. PCCPA is a substance which has a hole-transporting property and BisDCJTM is a substance which emits red light. The thickness of the second layer was 10 nm.

Then, PCCPA and N-(9,10-diphenyl-2-anthryl)-N,9-diphenyl-9H-carbazol-3-amine (abbreviation: 2PCAPA) represented in the above structural formula (v) were co-evaporated with a ratio of PCCPA to 2PCAPA being 1 to 0.02, whereby a third layer was formed. PCCPA is a substance which has a hole-transporting property and 2PCAPA is a substance which emits green light. The thickness of the third layer was 10 nm.

Then, 9-[4-(10-phenyl-9-anthryl)phenyl]-9H-carbazole (abbreviation: CzPA) represented in the above structural formula (vi) and PCBAPA, which was used for forming the first layer, were co-evaporated with a ratio of CzPA to PCBAPA being 1 to 0.1, whereby a fourth layer was formed. CzPA is a substance which has an electron-transporting property. The thickness of the fourth layer was 30 nm.

Then, tris(8-quinolinolato)aluminum (abbreviation: Alq) represented in the above structural formula (vii) was deposited to a thickness of 10 nm by an evaporation method using resistance heating and bathophenanthroline (abbreviation: BPhen) represented in the above structural formula (viii) was subsequently deposited to a thickness of 20 nm by an evaporation method using resistance heating, whereby an electron-transporting layer was formed.

Then, lithium fluoride (LiF) was similarly deposited to a thickness of approximately 1 nm by an evaporation method using resistance heating, whereby an electron-injecting layer was formed. Finally, aluminum was deposited to a thickness of 200 nm, whereby a cathod was formed. Thus, the light-emitting element 1 was fabricated.

(Fabrication of Light-Emitting Element 2)

Up to formation of the hole-transporting layer, the light-emitting element 2 was fabricated in a similar manner to the light-emitting element 1. Then, a film of PCBAPA having a thickness of 30 nm was formed as the first layer.

Then, the second layer, the third layer, the fourth layer, the electron-transporting layer, the electron-injecting layer, and the cathode were fabricated in a similar manner to those in the light-emitting element 1. Thus, the light-emitting element 2 was fabricated.

(Fabrication of Comparative Light-Emitting Element)

Up to formation of the hole-transporting layer, the comparative light-emitting element was fabricated in a similar manner to the light-emitting elements 1 and 2. Then, the second layer, the third layer, the fourth layer, the electron-transporting layer, the electron-injecting layer, and the cathode were formed in a similar manner to those in the light-emitting elements 1 and 2 without forming the first layer. Thus, the comparative light-emitting element was fabricated.

Structures of the layers included in the light-emitting element 1, the light-emitting element 2, and the comparative light-emitting element which were fabricated as described above, are shown in the following Table 1.

TABLE 1

|  | the first layer | the second layer | the third layer | the fourth layer |
|---|---|---|---|---|
| light-emitting element 1 | PCBAPA(10 nm) | PCCPA:BisDCJTM | PCCPA:2PCAPA | CzPA:PCBAPA |
| light-emitting element 2 | PCBAPA(30 nm) | (10 nm 1:0.005) | (10 nm 1:0.02) | (30 nm 1:0.1) |
| comparative light-emitting element | — |  |  |  |

The thus obtained light-emitting element 1, light-emitting element 2, and comparative light-emitting element were sealed in a glove box under a nitrogen atmosphere so that they were not exposed to atmospheric air. Then, the operating characteristics of those light-emitting elements were measured. Note that the measurements were carried out at room temperature (in an atmosphere kept at 25° C.).

Figure 11:
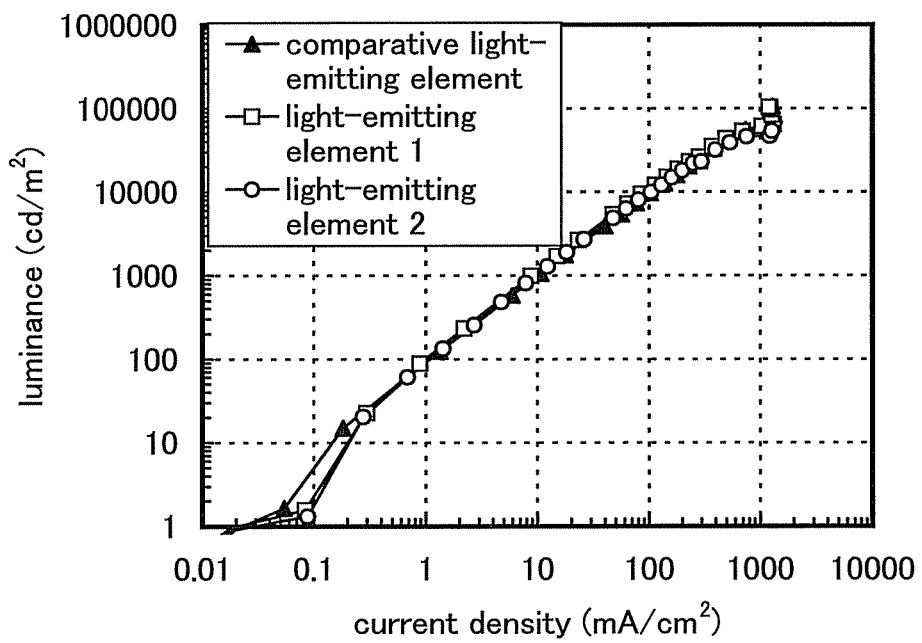
FIG. 11 is a graph showing current density-luminance characteristics of a light-emitting element 1, a light-emitting element 2, and a comparative light-emitting element.
Figure 12:
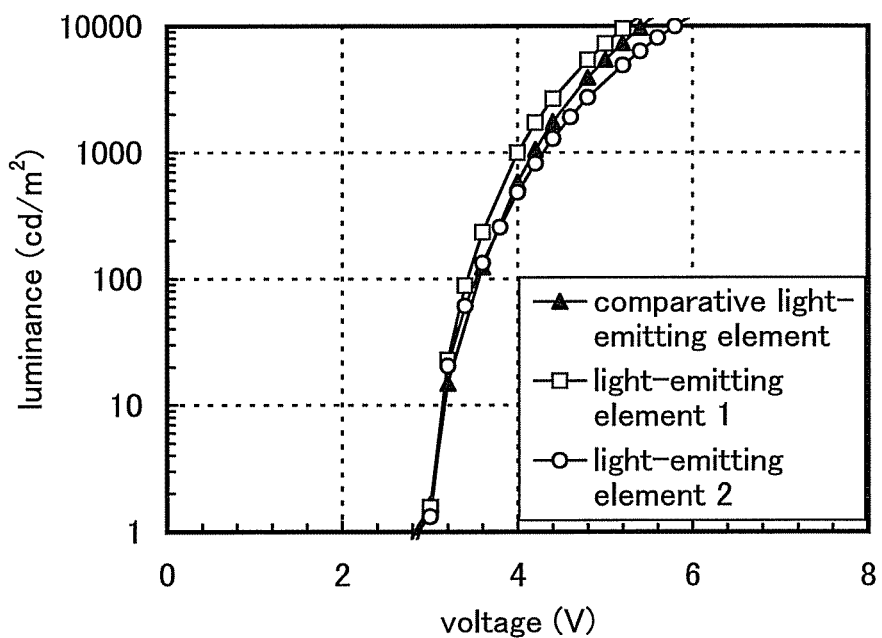
FIG. 12 is a graph showing voltage-luminance characteristics of the light-emitting element 1, the light-emitting element 2, and the comparative light-emitting element.
Figure 13:
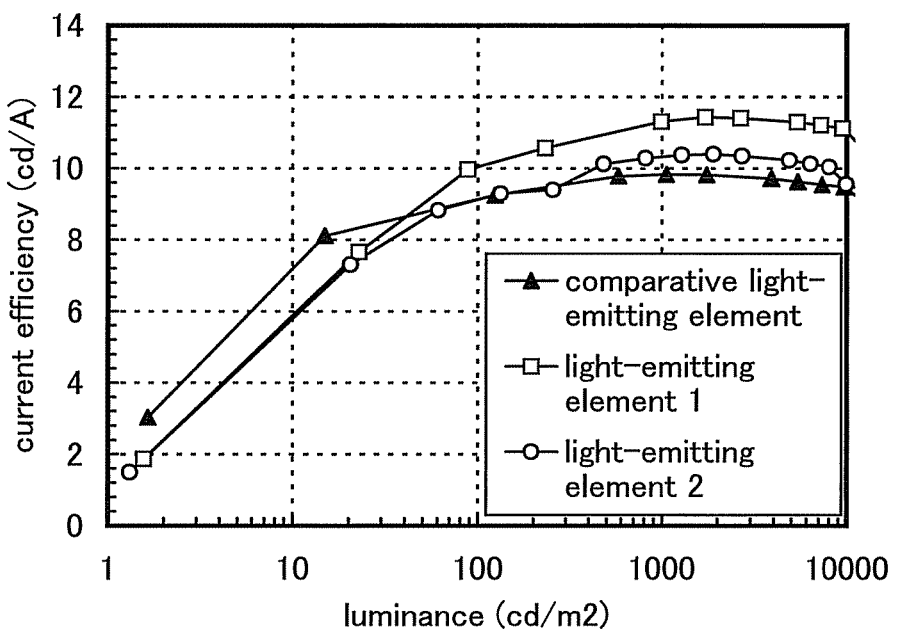
FIG. 13 is a graph showing luminance-current efficiency characteristics of the light-emitting element 1, the light-emitting element 2, and the comparative light-emitting element.
Figure 14:
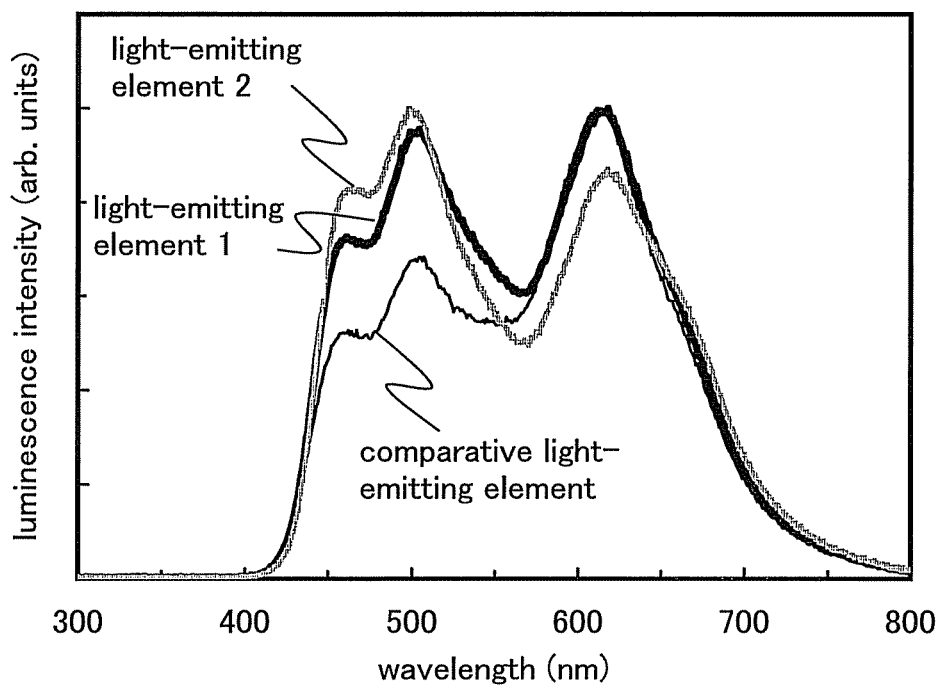
FIG. 14 is a graph showing emission spectra of the light-emitting element 1, the light-emitting element 2, and the comparative light-emitting element.

FIG. 11, FIG. 12, and FIG. 13 show current density-luminance characteristics, voltage-luminance characteristics, and luminance-current efficiency characteristics, respectively, of the light-emitting element 1, the light-emitting element 2, and the comparative light-emitting element. In addition, FIG. 14 shows emission spectra when a current of 1 mA flows to the light-emitting element 1, the light-emitting element 2, and the comparative light-emitting element.

Table 2 shows initial values of main characteristics of the light-emitting element 1, the light-emitting element 2, and the comparative light-emitting element at around 1000 cd/m².

TABLE 2

|  | voltage (V) | chromaticity (x, y) | current efficiency (cd/A) | external quantum efficiency (%) |
|---|---|---|---|---|
| light-emitting element 1 | 4.0 | (0.34, 0.37) | 11.3 | 5.8 |
| light-emitting element 2 | 4.2 | (0.32, 0.35) | 10.3 | 5.6 |
| comparative light-emitting element | 4.2 | (0.38, 0.37) | 9.83 | 5.0 |

From FIG. 11 and FIG. 12, there seems no large difference in current density-luminance characteristics and voltage-luminance characteristics among the comparative light-emitting element, the light-emitting element 1, and light-emitting element 2. However, In FIG. 13, the luminance-current efficiency characteristics of the light-emitting element 1 and the light-emitting element 2 are better than that of the comparative light-emitting element. Further, in the emission spectra of FIG. 14, it is found that there is a large difference in peak intensity among the spectra of the comparative light-emitting element, the light-emitting element 1, and the light-emitting element 2. The chromaticity (the CIE chromaticity coordinates) in Table 2 show that there also is a large difference among the chromaticity coordinates of the comparative light-emitting element, the light-emitting element 1, and the light-emitting element 2. That is, colors of light emission are different depending on those light-emitting elements; therefore, it is not appropriate to compare those light-emitting elements from luminance and current efficiency. As for the external quantum efficiency, the external quantum efficiencies of the light-emitting element 1 and the light-emitting element 2 are higher than that of the comparative light-emitting element by equal to or greater than 10%. Therefore, it is found that because electrons which do not contribute to recombination in the vicinity of the interface between the third layer and the fourth layer are captured in the first layer and makes the electrons contribute to light emission, the light-emission efficiency is improved. Moreover, blue emission gets stronger, which improves the chromaticity of white light emission. In particular, the light-emitting element 1 shows an excellent external quantum efficiency of almost 6%.

In the light-emitting element 1, the light-emitting element 2, and the comparative light-emitting element, PCBAPA, which is a light-emitting substance of the first layer and the fourth layer, emits blue light; BisDCJTM, which is a light-emitting substance of the second layer, emits red light; and 2PCAPA, which is a light-emitting substance of the third layer, emits green light. In other words, in the emission spectra in FIG. 14, the peaks around 466 nm, 620 nm, and 505 nm represent light emitted from PCBAPA, BisDCJTM, and 2PCAPA, respectively.

Here, in the spectrum of the comparative light-emitting element, it is found that among the three emission peak intensities, the peak intensity at the longest wavelength of around 620 nm is the highest and the peak intensity of light with a shorter wavelength is lower. On the other hand, as for the light-emitting element 1 and the light-emitting element 2, well-balanced peak intensities at wavelength areas of green and blue can be observed. Also from the chromaticity coordinates shown in Table 2, it is found that the light-emitting element 1 and the light-emitting element 2 exhibit better white-light emission than the comparative light-emitting element. Accordingly, it is found that the emission color of the light-emitting element of this example can be easily adjusted.

Figure 15:
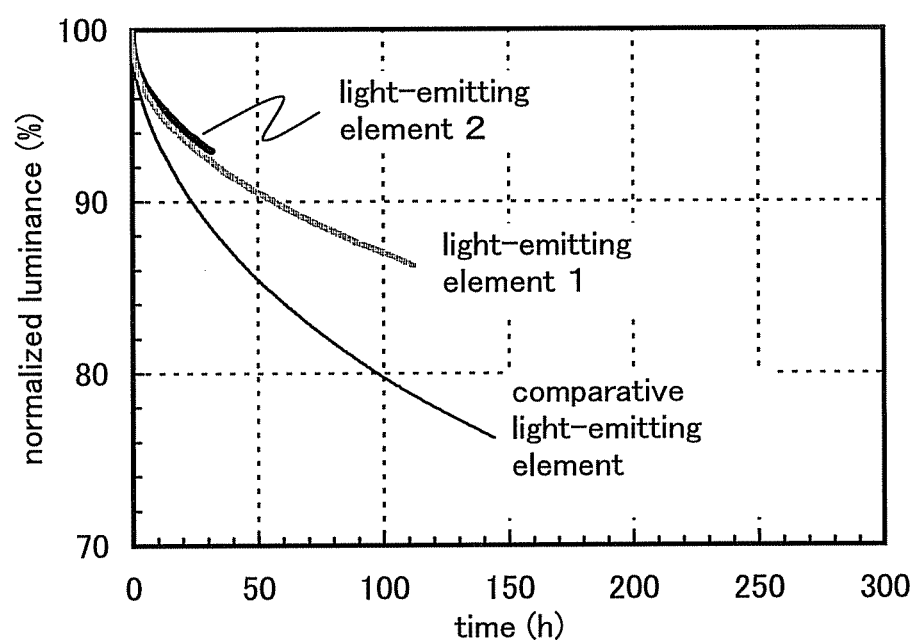
FIG. 15 is a graph showing luminance degradation curves of the light-emitting element 1, the light-emitting element 2, and the comparative light-emitting element.

Next, evaluation results of the reliability are shown. FIG. 15 shows time dependence of normalized luminance of the light-emitting element 1, the light-emitting element 2, and the comparative light-emitting element when they were driven at an initial luminance of 1000 cd/m² and constant current density. According to FIG. 15, it is clearly found that a decrease in luminance of the light-emitting element 1 and the light-emitting element 2 is suppressed more than that of the comparative light-emitting element. The main reason for this is probably that deterioration of the light-emitting element 1 and the light-emitting element 2 is reduced because the first layer prevents electrons from reaching the hole-transporting layer. From the above, it is found that in the light-emitting elements of this example, deterioration in luminance with time is suppressed compared with the conventional light-emitting element.

REFERENCE EXAMPLE

Since PCBAPA represented by the structural formula (ii) used in Example 1 and PCCPA represented by the structural formula (iii) used in Example 2 are not known materials, synthesis methods of PCBAPA and PCCPA are described below.

<<Synthesis method of PCBAPA>>

Step 1: Synthesis of 9-phenyl-9H-carbazole-3-boronic acid

Into a 500 mL three-neck flask were put 10 g (31 mmol) of 3-bromo-9-phenyl-9H-carbazole, and the air in the flask was replaced with nitrogen. After the replacement, 150 mL of tetrahydrofuran (THF), which was a solvent, was put into the flask and 3-bromo-9-phenyl-9H-carbazole was dissolved.

This solution was cooled down to −80° C. Into this solution was dropped 20 mL (32 mmol) of n-butyllithium (a 1.58 mol/L hexane solution) with a syringe. After the dropping, the solution was stirred at the same temperature for 1 hour. After the stirring, 3.8 mL (34 mmol) of trimethyl borate was added to the solution, and the solution was stirred for about 15 hours while the temperature of the solution was being raised to room temperature. After the stirring, about 150 mL of diluted hydrochloric acid (1.0 mol/L) was added to the solution, and then the solution was stirred for 1 hour. After the stirring, an organic layer is separated from the mixture, the aqueous layer was extracted from the mixture with ethyl acetate, and the extracted solution and the organic layer were combined and washed with saturated sodium bicarbonate. The combined organic layer was dried with magnesium sulfate. After the drying, the mixture was subjected to gravity filtration. The obtained filtrate was condensed to give an oily light brown substance. The obtained oily substance was dried under reduced pressure to give 7.5 g of a light brown solid, which was the object of the synthesis, in a yield of 86%. A synthesis scheme of Step 1 is shown in (a-1) given below.

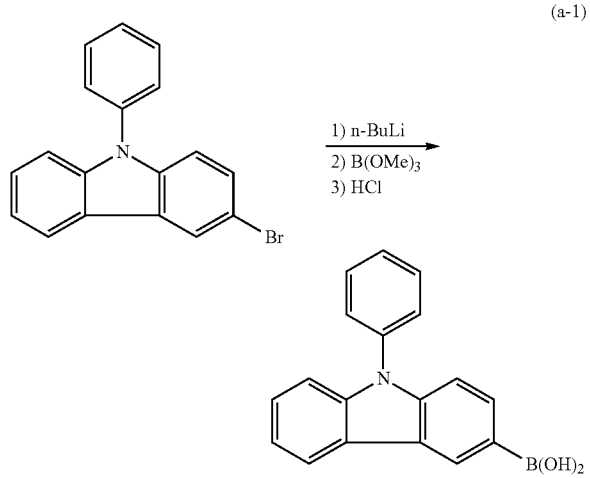

(a-1)

Step 2: Synthesis of 4-(9-phenyl-9H-carbazol-3-yl)diphenylamine (abbreviation: PCBA)

Into a 500 mL three-neck flask were put 6.5 g (26 mmol) of 4-bromodiphenylamine, 7.5 g (26 mmol) of 9-phenyl-9H-carbazole-3-boronic acid, and 400 mg (1.3 inmol) of tri(o-tolyl)phosphine. The air in the flask was replaced with nitrogen. To the mixture were added 100 mL of toluene, 50 mL of ethanol, and 14 mL of an aqueous solution of potassium carbonate (0.2 mol/L). Under reduced pressure, this mixture was degassed while being stirred. After the degassing, 67 mg (30 mmol) of palladium(II) acetate was added to the mixture. This mixture was refluxed at 100° C. for 10 hours. After the reflux, the organic layer of the mixture was separated, the aqueous layer was extracted with toluene, and the extracted solution was combined with the organic layer and then washed with a saturated aqueous sodium chloride solution. The combined organic layer was dried with magnesium sulfate. After the drying, this mixture was subjected to gravity filtration. The obtained filtrate was condensed to give an oily light brown substance. This oily substance was purified by silica gel column chromatography (a developing solvent was a mixed solvent of hexane:toluene=4:6). After the purification, the substance was condensed to give a white solid. The white solid was recrystallized with a mixed solvent of dichloromethane and hexane to give 4.9 g of a white solid, which was the object of the synthesis, in a yield of 45%. A synthesis scheme of Step 2 is shown in (a-2) given below.

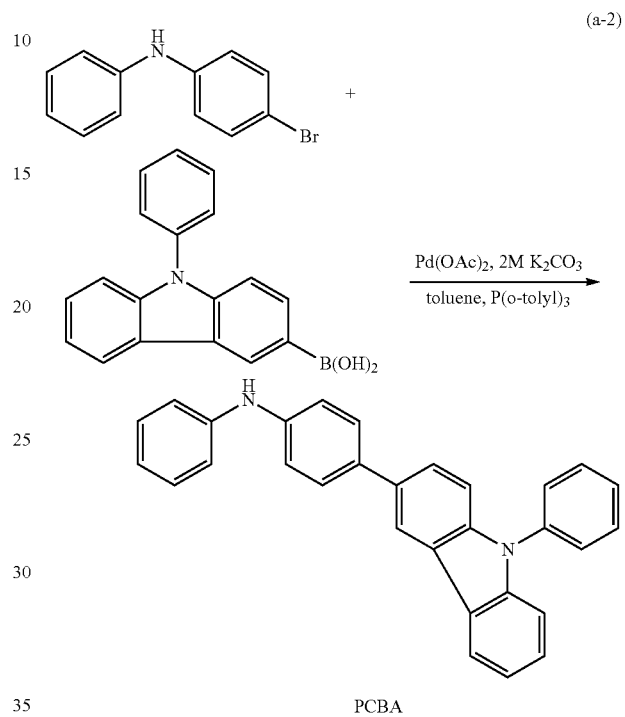

(a-2)

PCBA

Note that the white solid obtained in the above Step 2 was analyzed by nuclear magnetic resonance measurements (NMR). The measurement result is given below. The measurement result shows that PCBA, which serves as a source material of synthesis of PCBAPA, was obtained.

$^1$H NMR (DMSO-d$_6$, 300 MHz): δ=6.81-6.86 (m, 1H), 7.12 (dd, J$_1$=0.9 Hz, J$_2$=8.7 Hz, 2H), 7.19 (d, J=8.7 Hz, 2H), 7.23-7.32 (m, 3H), 7.37-7.47 (m, 3H), 7.51-7.57 (m, 1H), 7.61-7.73 (m, 7H), 8.28 (s, 1H), 8.33 (d, J=7.2 Hz, 1H), 8.50 (d, J=1.5 Hz, 1H)

Step 3: Synthesis of PCBAPA

Into a 300 mL three-neck flask were put 7.8 g (12 mmol) of 9-(4-bromophenyl)-10-phenylanthracene, 4.8 g (12 mmol) of PCBA, and 5.2 g (52 mmol) of sodium tert-butoxide. The air in the flask was replaced with nitrogen. To the mixture were added 60 mL of toluene and 0.30 mL of tri(tert-butyl)phosphine (a 10 wt % hexane solution). Under reduced pressure, this mixture was degassed while being stirred. After the degassing, 136 mg (0.24 mmol) of bis(dibenzylideneacetone)palladium(0) was added to the mixture. This mixture was stirred at 100° C. for 3 hours. After the stirring, about 50 mL of toluene was added to this mixture. The mixture was subjected to suction filtration through celite (produced by Wako Pure Chemical Industries, Ltd., Catalog No. 531-16855), alumina, and Florisil (produced by Wako Pure Chemical Industries, Ltd., Catalog No. 540-00135). The obtained filtrate was condensed to give a yellow solid. This solid was recrystallized with a mixed solvent of toluene and hexane to give 6.6 g of a light yellow solid of PCBAPA, which was the object of the synthesis, in a yield of 75%. Then, 3.0 g of the obtained light yellow powdered solid was sublimated and purified by train sublimation. For sublimation purification conditions, PCBAPA was heated at 350° C. under a pressure of 8.7 Pa with a flow rate of an argon gas of 3.0 mL/min. After the sublimation purification, 2.7 g of a light yellow solid of PCBAPA was recovered in a yield of 90%. A synthesis scheme of Step 3 is shown in (a-3) given below.

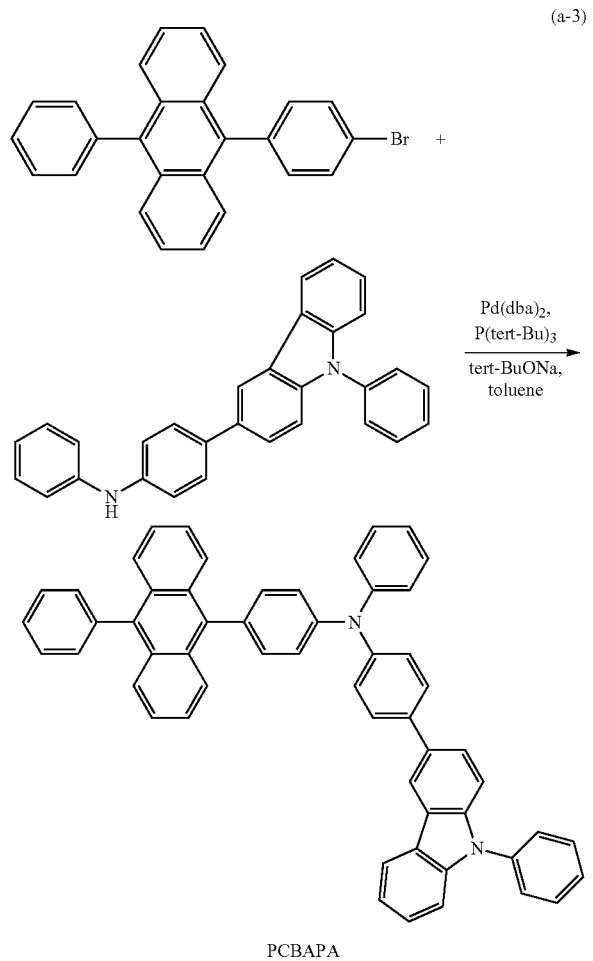

PCBAPA

The solid obtained in the above Step 3 was analyzed by $^1$H NMR. The measurement result is given below. The measurement result shows that PCBAPA was obtained.

$^1$H NMR (CDCl$_3$, 300 MHz): δ=7.09-7.14 (m, 1H), 7.28-7.72 (m, 33H), 7.88 (d, J=8.4 Hz, 2H), 8.19 (d, J=7.2 Hz, 1H), 8.37 (d, J=1.5 Hz, 1H).

Next, a synthesis method of PCCPA is described.

Step 1: Synthesis of 9-phenyl-3,3'-bi(9H-carbazole) (abbreviation: PCC)

Into a 200 mL three-neck flask were put 2.5 g (10 mmol) of 3-bromocarbazole, 2.9 g (10 mmol) of N-phenylcarbazole-3-boronate, and 152 mg (0.50 mmol) of tri(o-tolyl)phosphine. The air in the flask was replaced with nitrogen. To the mixture were added 50 mL of dimethoxyethanol (DME) and 10 mL of potassium carbonate solution (2 mol/L). Under reduced pressure, this mixture was degassed while being stirred. After the degassing, 50 mg (0.2 mmol) of palladium acetate was added to the mixture. This mixture was stirred at 80° C. for 3 hours under a stream of nitrogen. After the stirring, about 50 mL of toluene was added to this mixture. The mixture was stirred for about 30 minutes and then washed with water and a saturated aqueous sodium chloride solution in that order. After the washing, the organic layer was dried with magnesium sulfate. This mixture was subjected to gravity filtration. The obtained filtrate was condensed to give an oily substance. The obtained oily substance was dissolved in toluene. This solution was subjected to filtration through Florisil (produced by Wako Pure Chemical Industries, Ltd., Catalog No. 540-00135), alumina, and celite (produced by Wako Pure Chemical Industries, Ltd., Catalog No. 531-16855). The obtained filtrate was condensed to give 3.3 g of a white solid, which was the object of the synthesis, in a yield of 80%. A synthesis scheme of Step 1 is shown in (b-1) given below.

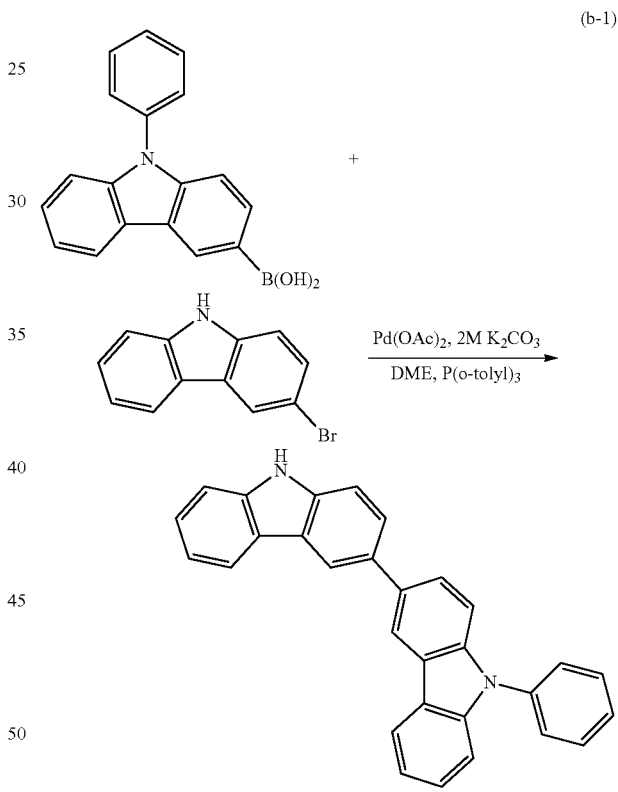

Note that the solid obtained in the above Step 1 was analyzed by nuclear magnetic resonance measurements (NMR). The measurement result is given below.

$^1$H NMR (DMSO-d$_6$, 300 MHz): δ=7.16-7.21 (m, 1H), 7.29-7.60 (m, 8H), 7.67-7.74 (m, 4H), 7.81-7.87 (m, 2H), 8.24 (d, J=7.8 Hz, 1H), 8.83 (d, J=7.8 Hz, 1H), 8.54 (d, J=1.5 Hz, 1H), 8.65 (d, J=1.5 Hz, 1H), 11.30 (s, 1H).

Step 2: Synthesis of PCCPA

Into a 100 mL three-neck flask were put 1.2 g (3.0 mmol) of 9-phenyl-10-(4-bromophenyl)anthracene, 1.2 g (3.0 mmol) of PCC, and 1.0 g (10 mmol) of tert-BuONa. The air in the flask was replaced with nitrogen. To the mixture were added 20 mL of toluene and 0.1 mL of tri(tert-butyl)phosphine (a 10 wt % of hexane solution). Under reduced pressure, this mixture was degassed while being stirred. After the degassing, 96 mg (0.17 mmol) of bis(dibenzylideneacetone)palladium(0) was added to the mixture. This mixture was refluxed at 110° C. for 8 hours under a stream of nitrogen. After the reflux, about 50 mL of toluene was added to this mixture. The mixture was stirred for about 30 minutes and then washed with water and a saturated aqueous sodium chloride solution in that order. After the washing, the organic layer was dried with magnesium sulfate. This mixture was subjected to gravity filtration. The obtained filtrate was condensed to give an oily substance. The obtained oily substance was purified by silica gel column chromatography (a developing solvent was a mixed solvent of hexane:toluene=1:1). After the purification, the substance was condensed to give a light yellow solid. The light yellow solid was recrystallized with chloroform/hexane to give 1.2 g of a light yellow powdered solid of PCCPA, which was the object of the synthesis, in a yield of 54%. Then, 2.4 g of the obtained light yellow powdered solid was sublimated and purified by train sublimation. For sublimation purification conditions, PCCPA was heated at 350° C. under a pressure of 8.7 Pa with a flow rate of an argon gas of 3.0 mL/min. After the sublimation purification, 2.2 g of a light yellow solid of PCCPA was recovered in a yield of 94%. A synthesis scheme of Step 2 is shown in (b-2) given below.

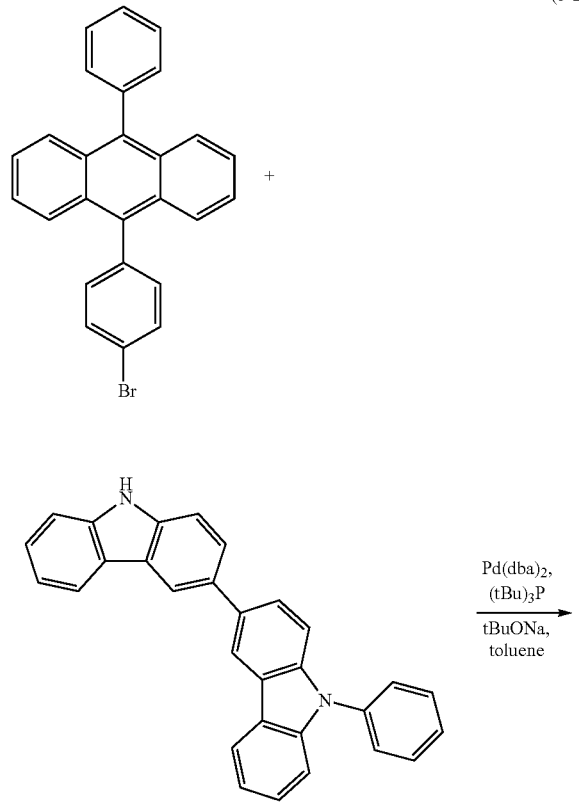

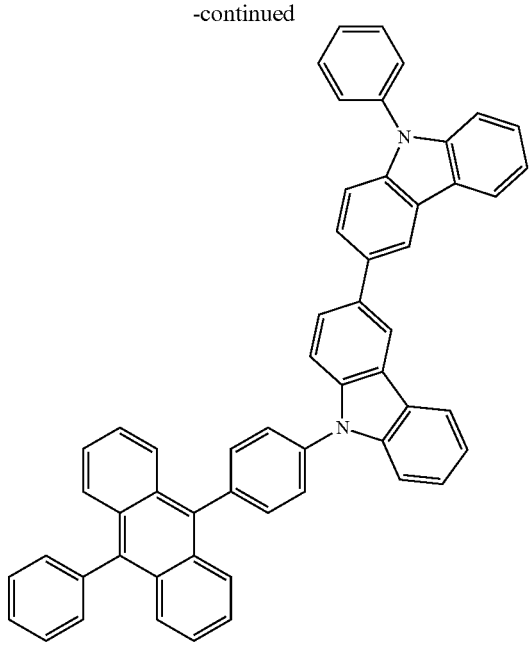

The solid obtained in the above Step 2 was analyzed by $^1$H NMR. The measurement result is given below. The measurement result shows that PCCPA was produced.

$^1$H NMR (CDCl$_3$, 300 MHz): δ=7.34-7.91 (m, 32H), 8.27 (d, J=7.2 Hz, 1H), 8.31 (d, J=7.5 Hz, 1H), 8.52 (dd, J$_1$=1.5 Hz, J$_2$=5.4 Hz, 2H).

This application is based on Japanese Patent Application serial No. 2008-130012 filed with Japan Patent Office on May 16, 2008, the entire contents of which are hereby incorporated by reference.

What is claimed is:
1. A light-emitting element comprising:
an anode;
a cathode;
a hole-transporting layer and an electron-transporting layer between the anode and the cathode; and
a layer including an organic compound between the hole-transporting layer and the electron-transporting layer,
wherein the layer including an organic compound at least includes a layer serving as a light-emitting layer in which a first layer, a second layer, a third layer, and a fourth layer are stacked in that order over the anode,
wherein the first layer includes a first light-emitting substance,
wherein the second layer includes a second organic compound and a second light-emitting substance,
wherein the third layer includes a third organic compound and a third light-emitting substance,
wherein the fourth layer includes a fourth organic compound and a fourth light-emitting substance,
wherein emission peak wavelengths of the first light-emitting substance and the fourth light-emitting substance are shorter than an emission peak wavelength of the third light-emitting substance,
wherein the emission peak wavelength of the third light-emitting substance is shorter than an emission peak wavelength of the second light-emitting substance,
wherein the fourth organic compound includes 9-[4-(10-phenyl-9-anthryl)phenyl]-9H-carbazole (CzPA), and
wherein the first layer does not include the 9-[4-(10-phenyl-9-anthryl)phenyl]-9H-carbazole (CzPA).

2. The light-emitting element according to claim 1, wherein blue light is emitted from the first layer, red light is emitted from the second layer, green light is emitted from the third layer, and blue light is emitted from the fourth layer.

3. The light-emitting element according to claim 1, wherein a peak wavelength of light emitted from the first layer is in a range of 400 nm to 480 nm, a peak wavelength of light emitted from the second layer is in a range of 580 nm to 700 nm, a peak wavelength of light emitted from the third layer is in a range of 490 nm to 560 nm, and a peak wavelength of light emitted from the fourth layer is in a range of 400 nm to 480 nm.

4. The light-emitting element according to claim 1, wherein an emission spectrum of the light-emitting element includes at least one peak in each wavelength range of 400 nm to 480 nm, 490 nm to 560 nm, and 580 nm to 700 nm.

5. The light-emitting element according to claim 1, wherein light emitted from the light-emitting element is white light.

6. A lighting apparatus comprising:
the light-emitting element according to claim 1.

7. A light-emitting device comprising:
the light-emitting element according to claim 1, and
a means for controlling light emission from the light-emitting element.

8. The light-emitting element according to claim 1, wherein the first light-emitting substance is a same as the fourth light-emitting substance.

9. The light-emitting element according to claim 1, wherein the light-emitting element is incorporated in one selected from the group consisting of a television device, a computer, a cellular phone and a camera.

10. A light-emitting element comprising:
an anode;
a cathode;
a hole-transporting layer and an electron-transporting layer between the anode and the cathode; and
a layer including an organic compound between the hole-transporting layer and the electron-transporting layer,
wherein the layer including an organic compound at least includes a layer serving as a light-emitting layer in which a first layer, a second layer, a third layer, and a fourth layer are stacked in that order over the anode,
wherein the first layer includes a first light-emitting substance,
wherein the second layer includes a second organic compound and a second light-emitting substance,
wherein the third layer includes a third organic compound and a third light-emitting substance,
wherein the fourth layer includes a fourth organic compound and a fourth light-emitting substance,
wherein a rate of the first light-emitting substance in the first layer is equal to or greater than 0.1 wt % and less than 50 wt %,
wherein a rate of the second light-emitting substance in the second layer is equal to or greater than 0.1 wt % and less than 50 wt %,
wherein a rate of the third light-emitting substance in the third layer is equal to or greater than 0.1 wt % and less than 50 wt %,
wherein a rate of the fourth light-emitting substance in the fourth layer is equal to or greater than 0.1 wt % and less than 50 wt %,
wherein emission peak wavelengths of the first light-emitting substance and the fourth light-emitting substance are shorter than an emission peak wavelength of the third light-emitting substance,
wherein the emission peak wavelength of the third light-emitting substance is shorter than an emission peak wavelength of the second light-emitting substance,
wherein the fourth organic compound includes 9–[4–(10-phenyl-9-anthryl)phenyl]–9$H$-carbazole (CzPA), and
wherein the first layer does not include the 9–[4–(10-phenyl-9-anthryl)phenyl]–9$H$-carbazole (CzPA).

11. The light-emitting element according to claim 10, wherein each of the second organic compound and the third organic compound is one of tricyclic to hexacyclic condensed aromatic compounds.

12. The light-emitting element according to claim 10, wherein each of the second organic compound and the third organic compound is an anthracene derivative.

13. The light-emitting element according to claim 10, wherein blue light is emitted from the first layer, red light is emitted from the second layer, green light is emitted from the third layer, and blue light is emitted from the fourth layer.

14. The light-emitting element according to claim 10, wherein a peak wavelength of light emitted from the first layer is in a range of 400 nm to 480 nm, a peak wavelength of light emitted from the second layer is in a range of 580 nm to 700 nm, a peak wavelength of light emitted from the third layer is in a range of 490 nm to 560 nm, and a peak wavelength of light emitted from the fourth layer is in a range of 400 nm to 480 nm.

15. The light-emitting element according to claim 10, wherein an emission spectrum of the light-emitting element includes at least one peak in each wavelength range of 400 nm to 480 nm, 490 nm to 560 nm, and 580 nm to 700 nm.

16. The light-emitting element according to claim 10, wherein light emitted from the light-emitting element is white light.

17. A lighting apparatus comprising:
the light-emitting element according to claim 10.

18. A light-emitting device comprising:
the light-emitting element according to claim 10, and
a means for controlling light emission from the light-emitting element.

19. The light-emitting element according to claim 10, wherein the first light-emitting substance is a same as the fourth light-emitting substance.

20. The light-emitting element according to claim 10, wherein the light-emitting element is incorporated in one selected from the group consisting of a television device, a computer, a cellular phone and a camera.

* * * * *

UNITED STATES PATENT AND TRADEMARK OFFICE
CERTIFICATE OF CORRECTION

| | | |
|---|---|---|
| PATENT NO. | : 8,530,060 B2 | Page 1 of 1 |
| APPLICATION NO. | : 12/463576 | |
| DATED | : September 10, 2013 | |
| INVENTOR(S) | : Takahiro Ushikubo et al. | |

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 524 days.

Signed and Sealed this
Twenty-seventh Day of January, 2015

Michelle K. Lee
*Deputy Director of the United States Patent and Trademark Office*